(12) United States Patent
Yang

(10) Patent No.: US 10,281,218 B2
(45) Date of Patent: *May 7, 2019

(54) HEAT-DISSIPATING STRUCTURE HAVING SUSPENDED EXTERNAL TUBE AND INTERNALLY RECYCLING HEAT TRANSFER FLUID AND APPLICATION APPARATUS

(71) Applicant: Tai-Her Yang, Dzan-Hwa (TW)

(72) Inventor: Tai-Her Yang, Dzan-Hwa (TW)

( * ) Notice: Subject to any disclaimer, the term of this patent is extended or adjusted under 35 U.S.C. 154(b) by 763 days.

This patent is subject to a terminal disclaimer.

(21) Appl. No.: 13/937,366

(22) Filed: Jul. 9, 2013

(65) Prior Publication Data
US 2015/0000877 A1    Jan. 1, 2015

Related U.S. Application Data

(63) Continuation-in-part of application No. 13/927,240, filed on Jun. 26, 2013.

(51) Int. Cl.
| | | |
|---|---|---|
| *F28D 7/12* | (2006.01) | |
| *H01L 23/467* | (2006.01) | |
| *H01L 23/34* | (2006.01) | |
| *F28D 15/00* | (2006.01) | |
| *F28D 1/053* | (2006.01) | |

(Continued)

(52) U.S. Cl.
CPC .............. *F28D 7/12* (2013.01); *F28D 1/053* (2013.01); *F28D 15/00* (2013.01); *F28F 13/06* (2013.01); *H01L 23/34* (2013.01); *H01L 23/467* (2013.01); *F21V 29/59* (2015.01); *F21V 29/77* (2015.01); *F28D 15/025* (2013.01); *F28D 15/0266* (2013.01); *F28D 2021/0028* (2013.01); *F28F 2250/08* (2013.01); *H01L 23/427* (2013.01); *H01L 23/44* (2013.01)

(58) Field of Classification Search
CPC ......... F24J 3/084; H01L 23/34; H01L 23/427; H01L 23/44; H01L 23/473; H01L 2023/4043; H01L 23/467; F28D 7/12; F28D 1/053; F28F 13/06
USPC ......................................................... 165/45
See application file for complete search history.

(56) References Cited

U.S. PATENT DOCUMENTS 3,921,201 A * 11/1975 Eisele .................... H01L 23/427
165/80.4
4,036,291 A * 7/1977 Kobayashi ............ H01L 23/427
165/104.21

(Continued)

*Primary Examiner* — Devon Russell
(74) *Attorney, Agent, or Firm* — Bacon & Thomas, PLLC

(57) ABSTRACT

The present invention is provided with a suspended external tube (101) and an inner tube (103) installed therein, wherein the diameter differentiation between the inner diameter of the external tube and the outer diameter of the inner tube is served to constitute a partitioned space as the fluid path, the front tube of the external tube is served to be installed with an electric energy application device assembly (108), and through the fluid pump (105) serially installed to the heat transfer fluid path pumping the heat transfer fluid to form a closed recycling fluid path, and through the exposed portion of the outer surface of the suspended external tube (101), temperature equalizing operation is enabled to perform with the external gaseous environment or the liquid or solid environment manually installed but not disposed in the stratum or liquid of the shallow ground natural thermal energy body.

36 Claims, 13 Drawing Sheets

(51) Int. Cl.
  *F28F 13/06* (2006.01)
  *H01L 23/427* (2006.01)
  *H01L 23/44* (2006.01)
  *F28D 15/02* (2006.01)
  *F28D 21/00* (2006.01)
  *F21V 29/77* (2015.01)
  *F21V 29/58* (2015.01)

(56) References Cited

U.S. PATENT DOCUMENTS

| | | | | |
|---|---|---|---|---|
| 4,058,159 A | * | 11/1977 | Iriarte | F28D 15/046 122/366 |
| 4,252,185 A | * | 2/1981 | Kosson | F24J 2/32 122/33 |
| 4,640,347 A | * | 2/1987 | Grover | F28D 15/0233 165/104.21 |
| 5,036,908 A | * | 8/1991 | Petroff | F28D 15/025 165/104.19 |
| 6,019,165 A | * | 2/2000 | Batchelder | F25B 21/02 165/104.33 |
| 8,141,620 B1 | * | 3/2012 | Zrodnikov | F25B 45/00 165/104.32 |
| 8,919,427 B2 | * | 12/2014 | Wang | B23P 15/26 165/104.21 |
| 9,139,931 B2 | * | 9/2015 | Meyer | C30B 11/003 |
| 2007/0209379 A1 | * | 9/2007 | Lenhardt | G06F 1/20 62/259.2 |
| 2007/0235180 A1 | * | 10/2007 | Ouyang | H01L 23/473 165/287 |
| 2008/0128114 A1 | * | 6/2008 | Lai | G06F 1/20 165/80.4 |
| 2010/0305918 A1 | * | 12/2010 | Udell | F24J 3/081 703/2 |
| 2010/0314070 A1 | * | 12/2010 | Yang | F24J 3/083 165/45 |
| 2014/0252585 A1 | * | 9/2014 | Chen | H01L 23/473 257/692 |

* cited by examiner

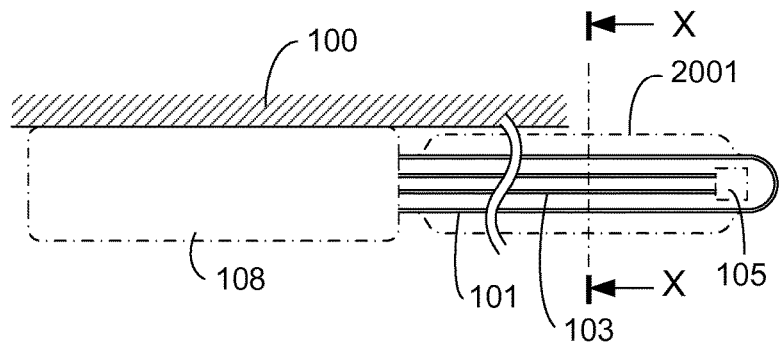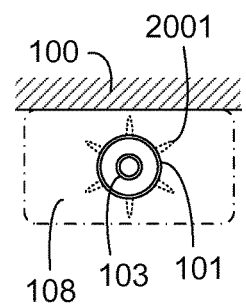
FIG. 1  FIG. 2
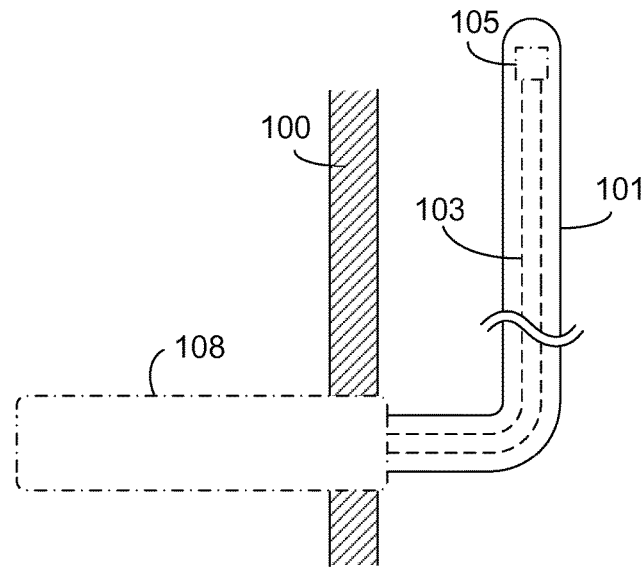
FIG. 3
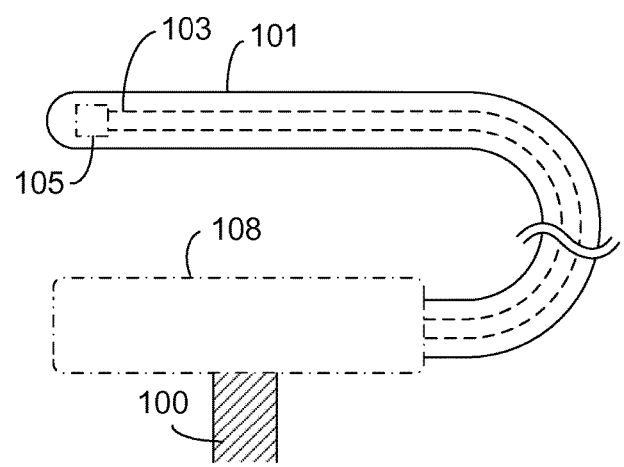
FIG. 4

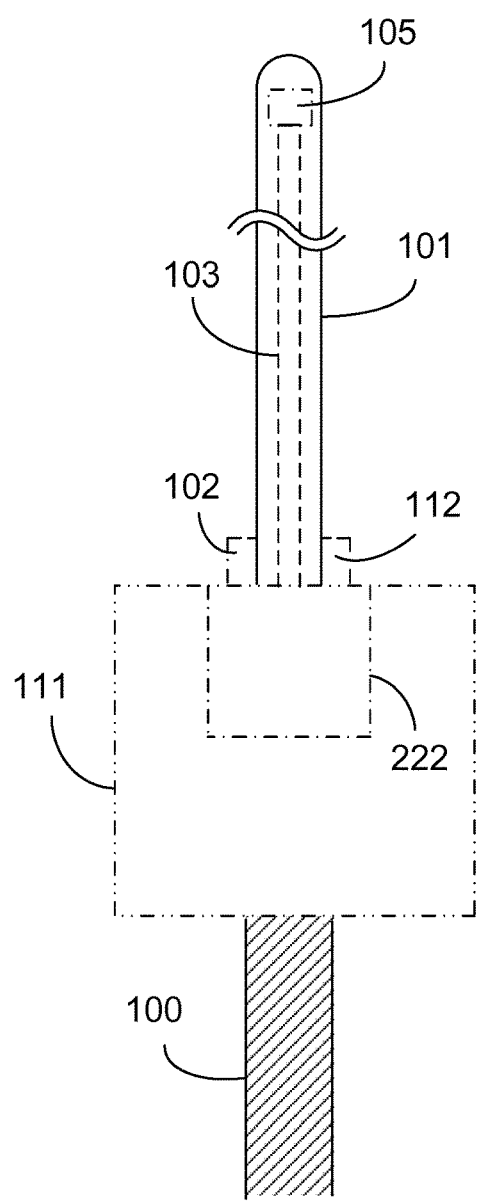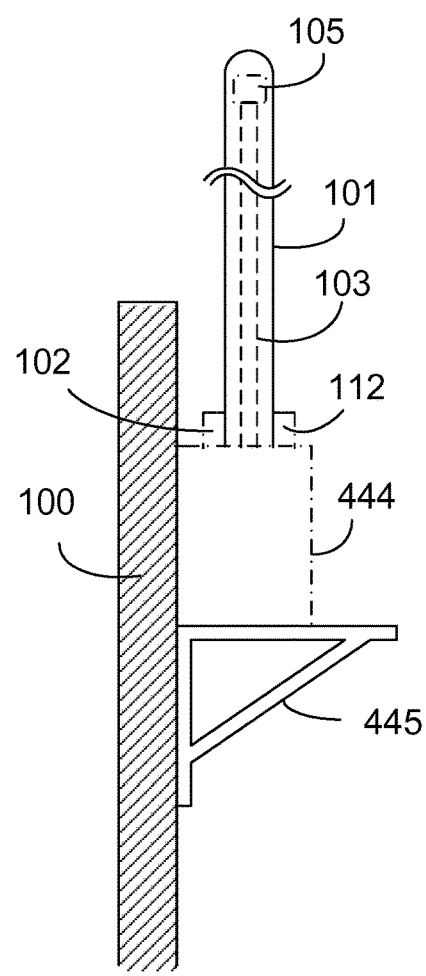
FIG. 14
FIG. 15

HEAT-DISSIPATING STRUCTURE HAVING SUSPENDED EXTERNAL TUBE AND INTERNALLY RECYCLING HEAT TRANSFER FLUID AND APPLICATION APPARATUS

CROSS REFERENCE TO RELATED APPLICATION

This is a Continuation-In-Part of application Ser. No. 13/927,240, filed on Jun. 26, 2013.

BACKGROUND OF THE INVENTION (a) Field of the Invention

The present invention is to provide one or more than one of external tubes (101) suspendedly installed and capable of performing temperature equalizing operation with an external gaseous environment or a liquid or solid environment which is manually installed but not disposed in the stratum or liquid of the shallow ground natural thermal energy body, the interior of the external tube (101) is provided with an inner tube (103), the inner diameter of the external tube (101) is larger than the outer diameter of the inner tube (103), the space defined by the diameter differentiation is formed as a heat transfer fluid path, the distal end of the external tube (101) is sealed, the distal end of the inner tube (103) is shorter than the distal end of the external tube (101) or preformed with fluid holes, the distal ends of both tubes are formed with a flow returning segment allowing the heat transfer fluid to be returned;

The front tube port of the external tube (101) and the front tube port of the inner tube (103) allow the heat transfer fluid passing an electric energy application device assembly (108) and/or a heat dissipater thereof to be transferred, wherein one of the tube ports allows the heat transfer fluid to be transferred for passing the electric energy application device assembly (108) and/or the heat dissipater thereof, and the other tube port allows the heat transfer fluid which already passed the electric energy application device assembly (108) and/or the heat dissipater thereof to be returned;

When two or more than two of the external tubes (101) are installed and individually provided with the inner tube (103) therein, the fluid paths formed by the individual external tube (101) and the inner tube (103) thereof can be connected in serial or in parallel and leaded to a common electric energy application device assembly (108), or respectively leaded to a corresponding electric energy application device assembly (108), and can be designed to share a common fluid pump (105) or respectively installed with a fluid pump (105);

One or more than one of fluid pumps (105) are serially installed on the closed recycling heat transfer fluid path, the flowing direction thereof can be selected from one flowing direction or two flowing directions enabled to be switched or periodically changed;

The gaseous or liquid heat transfer fluid pumped by the fluid pump (105) passes the external tube (101) of the closed recycling heat transfer fluid path and the exposed portion of the relevant structure, thereby enabling to perform temperature equalizing operation with the external gaseous environment or the liquid or solid environment manually installed but not disposed in the stratum or liquid of the shallow ground natural thermal energy body;

When the external tube (101) is formed as a vertically upward or obliquely upward or spirally upward structure, the fluid can take advantage of the physical effect of hot ascending/cold descending to allow the fluid having higher temperature to ascend in the inner tube and the fluid having lower temperature to descend in the interior of the external tube, thereby forming a flow recycling, and/or the fluid pump (105) can be further installed.

(b) Description of the Prior Art

A conventional electric energy application device assembly, e.g. an illumination device utilizing electric energy being converted into photo energy, an illumination device adopting LED, a photovoltaic, a wind power generator, a transformer or a motor, generates thermal energy while being operated, so over-heating prevention or anti-freezing for the mentioned assembly is very important.

SUMMARY OF THE INVENTION

The present invention is to provide one or more than one of external tubes (101) suspendedly installed and capable of performing temperature equalizing operation with an external gaseous environment or a liquid or solid environment which is manually installed but not disposed in the stratum or liquid of the shallow ground natural thermal energy body, the interior of the external tube (101) is provided with an inner tube (103), the inner diameter of the external tube (101) is larger than the outer diameter of the inner tube (103), the space defined by the diameter differentiation is formed as a heat transfer fluid path, the distal end of the external tube (101) is sealed, the distal end of the inner tube (103) is shorter than the distal end of the external tube (101) or preformed with fluid holes, the distal ends of both tubes are formed with a flow returning segment allowing the heat transfer fluid to be returned;

The front tube port of the external tube (101) and the front tube port of the inner tube (103) allow the heat transfer fluid passing an electric energy application device assembly (108) and/or a heat dissipater thereof to be transferred, wherein one of the tube ports allows the heat transfer fluid to be transferred for passing the electric energy application device assembly (108) and/or the heat dissipater thereof, and the other tube port allows the heat transfer fluid which already passed the electric energy application device assembly (108) and/or the heat dissipater thereof to be returned;

When two or more than two of the external tubes (101) are installed and individually provided with the inner tube (103) therein, the fluid paths formed by the individual external tube (101) and the inner tube (103) thereof can be connected in serial or in parallel and leaded to a common electric energy application device assembly (108), or respectively leaded to a corresponding electric energy application device assembly (108), and can be designed to share a common fluid pump (105) or respectively installed with a fluid pump (105);

One or more than one of fluid pumps (105) are serially installed on the closed recycling heat transfer fluid path, the flowing direction thereof can be selected from one flowing direction or two flowing directions enabled to be switched or periodically changed;

The structure of the heat transfer fluid path formed between the mentioned electric energy application device assembly (108) and/or the heat dissipater thereof and the external tube (101) and the inner tube (103) includes one or more than one of followings:

(a) the interior of the electric energy application device assembly (108) is formed with one or more than one of heat transfer fluid paths connected in serial or in parallel to pass through, the fluid inlet port and the fluid outlet port are respectively communicated with the tube port of the external tube (101) and the tube port of the inner tube (103);

(b) the heat dissipater installed in the electric energy application device assembly (108) is formed with one or more than one of heat transfer fluid paths connected in parallel to pass through, the fluid inlet port and the fluid outlet port are respectively communicated with the tube port of the external tube (101) and the tube port of the inner tube (103);

(c) one or more than one of heat transfer fluid paths formed in the interior of the electric energy application device assembly (108) are connected in serial or in parallel with the heat transfer fluid paths formed in the heat dissipater, the fluid inlet port and the fluid outlet port are respectively communicated with the tube port of the external tube (101) and the tube port of the inner tube (103);

(d) the electric energy application device assembly (108) is formed with two or more than two of heat transfer fluid paths connected through external tubes so as to form the fluid inlet port and the fluid outlet port respectively communicated with the tube port of the external tube (101) and the tube port of the inner tube (103), or the interior thereof is bent to the U-like shape or L-like shape, and the fluid inlet port and the flow outlet port at the same or different sides are respectively communicated with the tube port of the external tube (101) and the tube port of the inner tube (103);

(e) the exterior of the electric energy application device assembly (108) is installed with a sealed housing, thereby forming a space between the above two for allowing the heat transfer fluid to pass, the electric energy application device assembly (108) is formed with one or more than one of heat transfer fluid paths connected in serial or in parallel, one end thereof is formed with a heat transfer fluid inlet/outlet port which is leaded to the tube port of the inner tube (103), the tube port at the other end is leaded to the space formed between the housing and the electric energy application device assembly (108), and a heat transfer fluid connection port is formed on the sealed housing for being communicated with the tube port of the external tube (101);

(f) a sealed space allowing the heat transfer fluid to pass is formed between the electric energy application device assembly (108) and the heat dissipater thereof, and the exterior and the installed housing, the electric energy application device assembly (108) and/or the heat dissipater thereof is formed with one or more than one of heat transfer fluid paths connected in serial or in parallel, one end thereof is formed with a heat transfer fluid inlet/outlet port which is leaded to the tube port of the inner tube (103), the tube port at the other end is leaded to the space formed between the housing and the electric energy application device assembly (108) and/or the heat dissipater thereof, a heat transfer fluid inlet/outlet port is formed on the sealed housing for being communicated with the tube port of the external tube (101);

(g) a sealed housing is jointly formed through the exterior of the electric energy application device assembly (108) and/or the heat dissipater thereof and the matched housing, the interior of the electric energy application device assembly (108) and/or the heat dissipater thereof and the matched housing is formed with a space allowing the heat transfer fluid to pass and leaded to the tube port of the external tube (101), the electric energy application device assembly (108) and/or the heat dissipater thereof is formed with one or more than one of heat transfer fluid paths connected in serial or in parallel, one end thereof is formed with a heat transfer fluid connection port which is leaded to the tube port of the inner tube (103), the tube port at the other end is leaded to the space formed between the housing and the electric energy application device assembly (108) and/or the heat dissipater thereof, a heat transfer fluid connection port is formed on the sealed housing for being communicated with the tube port of the external tube (101);

The gaseous or liquid heat transfer fluid pumped by the fluid pump (105) passes the external tube (101) of the closed recycling heat transfer fluid path and the exposed portion of the relevant structure, thereby enabling to perform temperature equalizing operation with the external gaseous environment or the liquid or solid environment manually installed but not disposed in the stratum or liquid of the shallow ground natural thermal energy body;

When the external tube (101) is formed as a vertically upward or obliquely upward or spirally upward structure, the fluid can take advantage of the physical effect of hot ascending/cold descending to allow the fluid having higher temperature to ascend in the inner tube and the fluid having lower temperature to descend in the interior of the external tube, thereby forming a flow recycling, and/or the fluid pump (105) can be further installed;

The mentioned electric energy application device assembly (108) includes an illumination device utilizing electric energy being converted into photo energy, e.g. an illumination device adopting LED and/or a photovoltaic, e.g. a solar panel and/or a wind power generator and/or a transformer and/or an electric driven motor, and/or a heat discharging device used for discharging heat to the exterior or an electric heater or air warmer or heat pump having the heat discharging device, and/or a cold discharging device used for discharging cold to the exterior or an air conditioner having the cold discharging device, and peripheral devices, drive control circuits devices, overload protecting devices and/or temperature protection devices are optionally installed according to actual needs for assisting the operation of the electric energy application device assembly (108).

BRIEF DESCRIPTION OF THE DRAWINGS

FIG. 1 is a schematic view showing the main structure of the present invention.

FIG. 2 is a cross section view of FIG. 1 taken along X-X.

FIG. 3 is a schematic structural view illustrating the mechanical structure between the external tube (101) and the electric energy application device assembly (108) being formed in a bending structure with vertical angle or certain non-vertical angle.

FIG. 4 is a schematic structural view illustrating the mechanical structure between the external tube (101) and the electric energy application device assembly (108) being formed in a U-shaped structure.

FIG. 14 is a schematic structural view of the present invention illustrating the wind power generating device (111) being adopted as the electric energy application device assembly (108).

FIG. 15 is a schematic structural view of the present invention illustrating the transformer (444) being adopted as the electric energy application device assembly (108).

DESCRIPTION OF MAIN COMPONENT SYMBOLS

Figure 5:
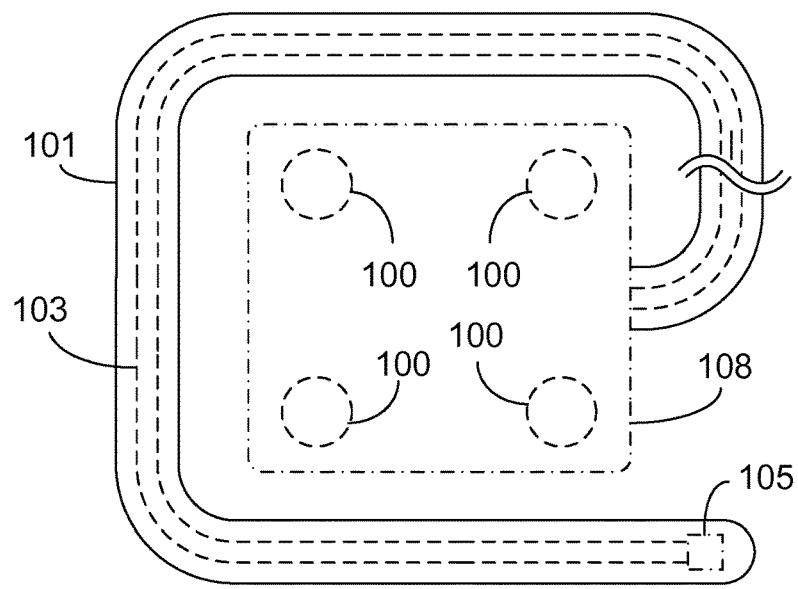
FIG. 5 is a schematic structural view illustrating the mechanical structure between the external tube (101) and the electric energy application device assembly (108) being formed in a swirl structure with one or more loops.

100: Fastening and supporting structural member
101: External tube
102: Temperature protecting device
103: Inner tube
1031: Transversal hole
1032: Notch
1033: Supporter
104: Heat dissipater
1041: Heat transfer fluid path of heat dissipater
1042: U-shaped connection tube
105: Fluid pump
106: Housing
1061: Light-pervious member
107: Heat transfer fluid path
108: Electric energy application device assembly
1081: Heat transfer fluid path of electric energy application device assembly
109: Electric illuminating device
110: Photovoltaic
111: Wind power generating device 112: Drive control circuit device
201: External heat guiding plate
203: Inner heat guiding plate
222: Wind power generator
2001: Heat transfer fin
2003: Spiral flow guiding structure
333: Motor
334: Motor driving load
444: Transformer
445: Transformer support rack

DETAILED DESCRIPTION OF THE PREFERRED EMBODIMENTS

A conventional electric energy application device assembly, e.g. an illumination device utilizing electric energy being converted into photo energy, an illumination device adopting LED, a photovoltaic, a wind power generator, a transformer or a motor, generates thermal energy while being operated, so over-heating prevention or anti-freezing for the mentioned assembly is very important;

The present invention is to provide one or more than one of external tubes (101) suspendedly installed and capable of performing temperature equalizing operation with an external gaseous environment or a liquid or solid environment which is manually installed but not disposed in the stratum or liquid of the shallow ground natural thermal energy body, the interior of the external tube (101) is provided with an inner tube (103), the inner diameter of the external tube (101) is larger than the outer diameter of the inner tube (103), the space defined by the diameter differentiation is formed as a heat transfer fluid path, the distal end of the external tube (101) is sealed, the distal end of the inner tube (103) is shorter than the distal end of the external tube (101) or preformed with fluid holes, the distal ends of both tubes are formed with a flow returning segment allowing the heat transfer fluid to be returned;

The front tube port of the external tube (101) and the front tube port of the inner tube (103) allow the heat transfer fluid passing an electric energy application device assembly (108) and/or a heat dissipater thereof to be transferred, wherein one of the tube ports allows the heat transfer fluid to be transferred for passing the electric energy application device assembly (108) and/or the heat dissipater thereof, and the other tube port allows the heat transfer fluid which already passed the electric energy application device assembly (108) and/or the heat dissipater thereof to be returned;

When two or more than two of the external tubes (101) are installed and individually provided with the inner tube (103) therein, the fluid paths formed by the individual external tube (101) and the inner tube (103) thereof can be connected in serial or in parallel and leaded to a common electric energy application device assembly (108), or respectively leaded to a corresponding electric energy application device assembly (108), and can be designed to share a common fluid pump (105) or respectively installed with a fluid pump (105);

One or more than one of fluid pumps (105) are serially installed on the closed recycling heat transfer fluid path, the flowing direction thereof can be selected from one flowing direction or two flowing directions enabled to be switched or periodically changed;

The structure of the heat transfer fluid path formed between the mentioned electric energy application device assembly (108) and/or the heat dissipater thereof and the external tube (101) and the inner tube (103) includes one or more than one of followings:

(a) the interior of the electric energy application device assembly (108) is formed with one or more than one of heat transfer fluid paths connected in serial or in parallel to pass through, the fluid inlet port and the fluid outlet port are respectively communicated with the tube port of the external tube (101) and the tube port of the inner tube (103);

(b) the heat dissipater installed in the electric energy application device assembly (108) is formed with one or more than one of heat transfer fluid paths connected in parallel to pass through, the fluid inlet port and the fluid outlet port are respectively communicated with the tube port of the external tube (101) and the tube port of the inner tube (103);

(c) one or more than one of heat transfer fluid paths formed in the interior of the electric energy application device assembly (108) are connected in serial or in parallel with the heat transfer fluid paths formed in the heat dissipater, the fluid inlet port and the fluid outlet port are respectively communicated with the tube port of the external tube (101) and the tube port of the inner tube (103);

(d) the electric energy application device assembly (108) is formed with two or more than two of heat transfer fluid paths connected through external tubes so as to form the fluid inlet port and the fluid outlet port respectively communicated with the tube port of the external tube (101) and the tube port of the inner tube (103), or the interior thereof is bent to the U-like shape or L-like shape, and the fluid inlet port and the flow outlet port at the same or different sides are respectively communicated with the tube port of the external tube (101) and the tube port of the inner tube (103);

(e) the exterior of the electric energy application device assembly (108) is installed with a sealed housing, thereby forming a space between the above two for allowing the heat transfer fluid to pass, the electric energy application device assembly (108) is formed with one or more than one of heat transfer fluid paths connected in serial or in parallel, one end thereof is formed with a heat transfer fluid inlet/outlet port which is leaded to the tube port of the inner tube (103), the tube port at the other end is leaded to the space formed between the housing and the electric energy application device assembly (108), and a heat transfer fluid connection port is formed on the sealed housing for being communicated with the tube port of the external tube (101);

(f) a sealed space allowing the heat transfer fluid to pass is formed between the electric energy application device assembly (108) and the heat dissipater thereof, and the exterior and the installed housing, the electric energy application device assembly (108) and/or the heat dissipater thereof is formed with one or more than one of heat transfer fluid paths connected in serial or in parallel, one end thereof is formed with a heat transfer fluid inlet/outlet port which is leaded to the tube port of the inner tube (103), the tube port at the other end is leaded to the space formed between the housing and the electric energy application device assembly (108) and/or the heat dissipater thereof, a heat transfer fluid inlet/outlet port is formed on the sealed housing for being communicated with the tube port of the external tube (101);

(g) a sealed housing is jointly formed through the exterior of the electric energy application device assembly (108) and/or the heat dissipater thereof and the matched housing, the interior of the electric energy application device assembly (108) and/or the heat dissipater thereof and the matched housing is formed with a space allowing the heat transfer fluid to pass and leaded to the tube port of the external tube (101), the electric energy application device assembly (108) and/or the heat dissipater thereof is formed with one or more than one of heat transfer fluid paths connected in serial or in parallel, one end thereof is formed with a heat transfer fluid connection port which is leaded to the tube port of the inner tube (103), the tube port at the other end is leaded to the space formed between the housing and the electric energy application device assembly (108) and/or the heat dissipater thereof, a heat transfer fluid connection port is formed on the sealed housing for being communicated with the tube port of the external tube (101);

The gaseous or liquid heat transfer fluid pumped by the fluid pump (105) passes the external tube (101) of the closed recycling heat transfer fluid path and the exposed portion of the relevant structure, thereby enabling to perform temperature equalizing operation with the external gaseous environment or the liquid or solid environment manually installed but not disposed in the stratum or liquid of the shallow ground natural thermal energy body;

When the external tube (101) is formed as a vertically upward or obliquely upward or spirally upward structure, the fluid can take advantage of the physical effect of hot ascending/cold descending to allow the fluid having higher temperature to ascend in the inner tube and the fluid having lower temperature to descend in the interior of the external tube, thereby forming a flow recycling, and/or the fluid pump (105) can be further installed;

The mentioned electric energy application device assembly (108) includes an illumination device utilizing electric energy being converted into photo energy, e.g. an illumination device adopting LED and/or a photovoltaic, e.g. a solar panel and/or a wind power generator and/or a transformer and/or an electric driven motor, and/or a heat discharging device used for discharging heat to the exterior or an electric heater or air warmer or heat pump having the heat discharging device, and/or a cold discharging device used for discharging cold to the exterior or an air conditioner having the cold discharging device, and peripheral devices, drive control circuits devices, overload protecting devices and/or temperature protection devices are optionally installed according to actual needs for assisting the operation of the electric energy application device assembly (108);

Main components of the heat-dissipating structure having suspended external tube and internally recycling heat transfer fluid and application apparatus are illustrated by following embodiment:

FIG. 1 is a schematic view showing the main structure of the present invention.

Figure 6:
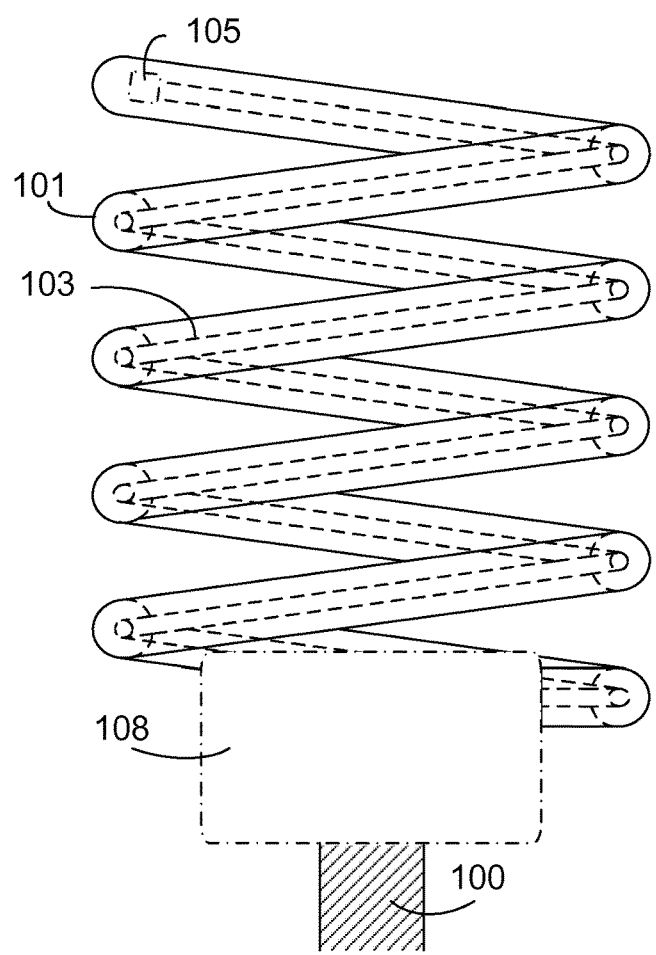
FIG. 6 is a schematic structural view illustrating the mechanical structure between the external tube (101) and the electric energy application device assembly (108) being formed in a spiral structure.
Figure 7:
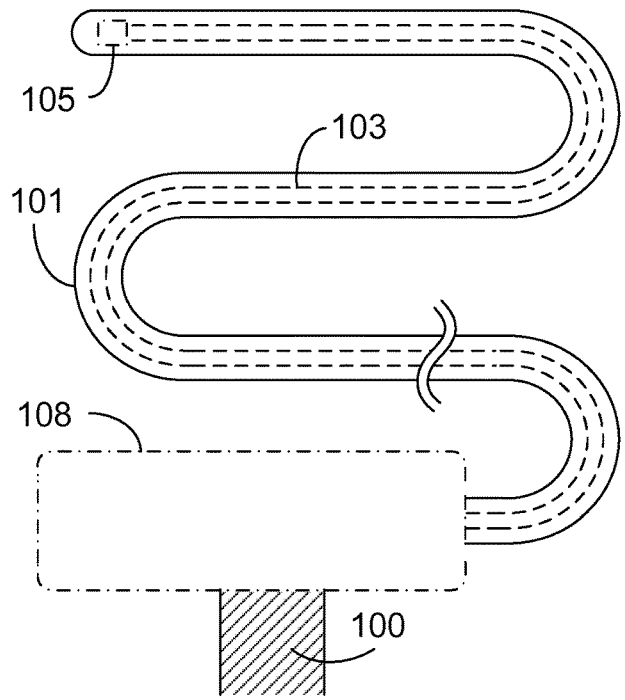
FIG. 7 is a schematic structural view illustrating the mechanical structure between the external tube (101) and the electric energy application device assembly (108) being formed in a wavelike bending structure oriented towards up/down or left/right.

FIG. 2 is a cross section view of FIG. 1 taken along X-X. As shown in FIG. 1 and FIG. 2, mainly consists:

external tube (101): constituted by one or more than one of hollow tube members with materials having mechanical strength, the tube body is divided into a front tube body, a mid tube body and a distal tube body, wherein:

The front tube body is mainly served to be installed with the electric energy application device assembly (108);

The mid tube body is served to provide a support function and to transfer the thermal energy between the interior and the exterior of the tube;

The distal tube body is served to perform temperature equalizing operation with the external gaseous environment or the liquid or solid environment manually installed but not disposed in the stratum or liquid of the shallow ground natural thermal energy body;

The external tube (101) includes being formed in round shape or other geometric shapes, and being made of a material having mechanical strength and better heat conductivity or a material having heat insulation property; the mentioned external tube (101) can be optionally installed with heat transfer fins (2001) at the exterior thereof according to actual needs;

The mentioned mechanical structure between the external tube (101) and the electric energy application device assembly (108) includes one or more than one of geometrically extended structures in one dimension or two dimensions or three dimensions; as followings (a) formed in the linear structure (as shown in FIG. 1);
(b) formed in the bending structure with vertical angle or certain non-vertical angle (as shown in FIG. 3);
(c) formed in the U-shaped structure (as shown in FIG. 4);
(d) formed in the swirl structure with one or more loops (as shown in FIG. 5);
(e) formed in the spiral structure (as shown in FIG. 6);
(f) formed in the wavelike bending structure oriented towards up/down or left/right (as shown in FIG. 7);

inner tube (103): constituted by a tube member having an outer diameter smaller than the inner diameter of the external tube (101) and made of a hard material, e.g. metal material, or a flexible material or a soft material, e.g. plastic, or a fabric or other materials having similar properties, the inner tube (103) is formed in a linear or bended or curved shaped or can be freely deformed if being made of the flexible material or the soft material thereby being enabled to be installed in the external tube (101) without affecting the smoothness of the heat transfer fluid path, the front portion thereof is leaded to the heat transfer fluid path of the electric energy application device assembly (108) or the heat dissipater thereof installed at the front portion of the external tube (101), the distal portion thereof is leaded to the mid portion or extended to the distal portion of the external tube (101), a diameter differentiation is formed between the outer diameter of the inner tube (103) and the inner diameter of the external tube (101) thereby forming a reversed space which can be served as the heat transfer fluid path, so the fluid path allowing the heat transfer fluid to pass is formed through the inner tube and two tube ports at two ends of the inner tube and the reserved space formed between the outer diameter of the inner tube and the inner diameter of the outer tube, and selected locations defined on the mentioned fluid path can be serially installed with one or more than one of fluid pumps (105), the space defined between the front portion of the inner tube (103) and the front portion of the external tube (101) is served to allow the electric energy application device assembly (108) to be installed;

The inner tube (103) includes being formed in round shape or other geometric shapes, and being made of (a) a hard material or flexible material or soft material having heat insulation property, or (b) a hard material or flexible material or soft material having better heat conductivity, and the exterior of the tube member is provided with a heat insulation material, or (c) a hard material or flexible material or soft material having better heat conductivity, and the interior of the tube member is provided with a heat insulation material, or (d) a hard material or flexible material or soft material having better heat conductivity;

When two or more than two of the external tubes (101) are installed and individually provided with the inner tube (103) therein, the fluid paths formed by the individual external tube (101) and the inner tube (103) thereof can be connected in serial or in parallel and leaded to a common electric energy application device assembly (108), or respectively leaded to a corresponding electric energy application device assembly (108), and can be designed to share a common fluid pump (105) or respectively installed with a fluid pump (105);

fluid pump (105): constituted by a pump driven by an electric motor, and used to pump the gaseous or liquid heat transfer fluid according to the controlled flowing direction and flowing rate;

electric energy application device assembly (108): served to be disposed on a fastening and supporting structural member (100) and constituted by an illumination device driven by electric energy, and/or a power generator driven by the kinetic power provided by external gaseous or liquid fluid, and/or a device driven by photo energy for generating electric energy and also generating thermal loss, and/or a transformer and/or an electric driven motor, and/or a heat discharging device used for discharging heat to the exterior or an electric heater or air warmer or heat pump having the heat discharging device, and/or a cold discharging device used for discharging cold to the exterior or an air conditioner having the cold discharging device, and peripheral devices, drive control circuits devices, overload protecting devices and/or temperature protection devices are optionally installed according to actual needs for assisting the operation of the electric energy application device assembly (108).

According to the heat-dissipating structure having suspended external tube and internally recycling heat transfer fluid and application apparatus, with the pumping operation provided by the fluid pump (105), the gaseous or liquid heat transfer fluid is allowed to pass the heat transfer fluid outlet port at the front portion of the inner tube (103), then pass the heat transfer fluid path formed on the surface or the interior of the electric energy application device assembly (108) which generates thermal loss during operation and the heat dissipater thereof, then pass the heat transfer fluid path formed by the separated space defined between the interior of the external tube (101) and the inner tube (103) thereby being leaded to the distal tube body of the external tube (101) then returned from the heat transfer fluid inlet port at the distal end of the inner tube (103), thereby forming a closed recycling heat transfer fluid loop, or the heat transfer fluid pumped by the fluid pump (105) can pass the mentioned paths in a reverse order and in the reverse flowing direction thereby forming a closed recycling heat transfer fluid loop having reverse order and reverse flowing direction, so through the heat transfer fluid passing the outer surface of the electric energy application device assembly (108) and the heat dissipater thereof, and/or the exposed portion of the external tube (101), temperature equalizing operation is enabled to be performed with the external gaseous environment or the liquid or solid environment manually installed but not disposed in the stratum or liquid of the shallow ground natural thermal energy body.

When the external tube (101) is formed as a vertically upward or obliquely upward or spirally upward structure, the fluid can take advantage of the physical effect of hot ascending/cold descending to allow the fluid having higher temperature to ascend in the inner tube and the fluid having lower temperature to descend in the interior of the external tube, thereby forming a flow recycling, and/or the fluid pump (105) can be further installed.

Figure 8:
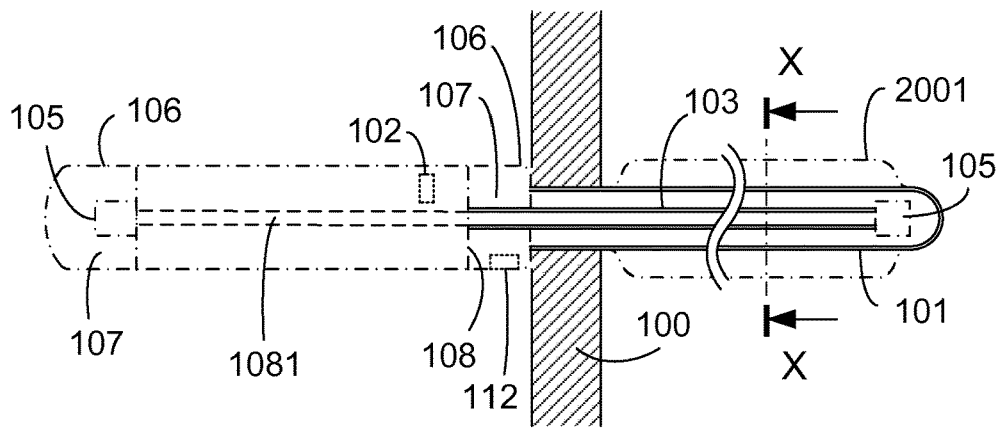
FIG. 8 is a schematic structural view showing the FIG. 1 being provided with a housing.

According to the heat-dissipating structure having suspended external tube and internally recycling heat transfer fluid and application apparatus, the front tube body of the external tube (101) which allows the electric energy application device assembly (108) to be installed can be further installed with a housing (106) for protecting the electric energy application device assembly (108), and the space formed through the surface of the electric energy application device assembly (108) or the surface of the heat dissipater thereof can be served as a heat transfer fluid path (107) for transferring the heat transfer fluid;

FIG. 8 is a schematic structural view showing the FIG. 1 being provided with a housing.

Figure 9:
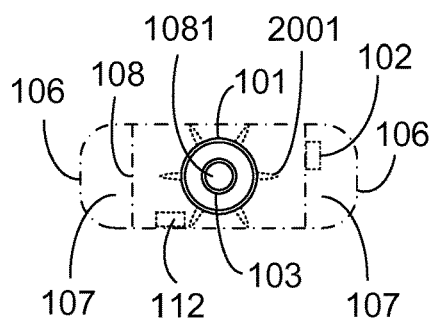
FIG. 9 is a cross section view of FIG. 8 taken along X-X.

FIG. 9 is a cross section view of FIG. 8 taken along X-X. As shown in FIG. 8 and FIG. 9, mainly consists:

external tube (101): constituted by one or more than one of hollow tube members with materials having mechanical strength, the tube body is divided into a front tube body, a mid tube body and a distal tube body, wherein:

The front tube body is mainly served to be installed with the electric energy application device assembly (108) and the housing (106);

The mid tube body is served to provide a support function and to transfer the thermal energy between the interior and the exterior of the tube;

The distal tube body is served to perform temperature equalizing operation with the external gaseous environment or the liquid or solid environment manually installed but not disposed in the stratum or liquid of the shallow ground natural thermal energy body;

The external tube (101) includes being formed in round shape or other geometric shapes, and being made of a material having mechanical strength and better heat conductivity or a material having heat insulation property; the mentioned external tube (101) can be optionally installed with heat transfer fins (2001) at the exterior thereof according to actual needs;

inner tube (103): constituted by a tube member having an outer diameter smaller than the inner diameter of the external tube (101) and made of a hard material, e.g. metal material, or a flexible material or a soft material, e.g. plastic, or a fabric or other materials having similar properties, the inner tube (103) is formed in a linear or bended or curved shaped or can be freely deformed if being made of the flexible material or the soft material thereby being enabled to be installed in the external tube (101) without affecting the smoothness of the heat transfer fluid path, the front portion thereof is leaded to the heat transfer fluid path of the electric energy application device assembly (108) or the heat dissipater thereof installed at the front portion of the external tube (101), the distal portion thereof is leaded to the mid portion or extended to the distal portion of the external tube (101), a diameter differentiation is formed between the outer diameter of the inner tube (103) and the inner diameter of the external tube (101) thereby forming a reversed space which can be served as the heat transfer fluid path, so the fluid path allowing the heat transfer fluid to pass is formed through the inner tube and two tube ports at two ends of the inner tube and the reserved space formed between the outer diameter of the inner tube and the inner diameter of the outer tube, and selected locations defined on the mentioned fluid path can be serially installed with one or more than one of fluid pumps (105), the space defined between the front portion of the inner tube (103) and the front portion of the external tube (101) is served to allow the electric energy application device assembly (108) to be installed;

The inner tube (103) includes being formed in round shape or other geometric shapes, and being made of (a) a hard material or flexible material or soft material having heat insulation property, or (b) a hard material or flexible material or soft material having better heat conductivity, and the exterior of the tube member is provided with a heat insulation material, or (c) a hard material or flexible material or soft material having better heat conductivity, and the interior of the tube member is provided with a heat insulation material, or (d) a hard material or flexible material or soft material having better heat conductivity;

When two or more than two of the external tubes (101) are installed and individually provided with the inner tube (103) therein, the fluid paths formed by the individual external tube (101) and the inner tube (103) thereof can be connected in serial or in parallel and leaded to a common electric energy application device assembly (108), or respectively leaded to a corresponding electric energy application device assembly (108), and can be designed to share a common fluid pump (105) or respectively installed with a fluid pump (105);

- fluid pump (105): constituted by a pump driven by an electric motor, and served for being used to pump the gaseous or liquid heat transfer fluid according to the controlled flowing direction and flowing rate;
- housing (106): made of a material having heat conductive or heat insulation property and used for covering the exterior of the electric energy application device assembly (108) so as to be sealed relative to the exterior, the heat transfer fluid is pumped by the fluid pump (105) for flowing from the heat transfer fluid outlet port at the front portion of the inner tube (103) to the space formed by the housing (106) and the electric energy application device assembly (108), then passing the heat transfer fluid path formed by the partitioned space defined by the inner diameter of the external tube (101) and the outer diameter of the inner tube (103) to be leaded towards the distal end of the external tube (101), then returning via the heat transfer fluid inlet port at the distal end of the inner tube (103), thereby forming a closed recycling heat transfer fluid loop, or forming a closed recycling heat transfer fluid loop having opposite flowing direction through changing the fluid flowing direction in which the fluid pump (105) is pumping;
- electric energy application device assembly (108): served to be disposed on a fastening and supporting structural member (100) and constituted by an illumination device driven by electric energy, and/or a power generator driven by the kinetic power provided by external gaseous or liquid fluid, and/or a device driven by photo energy for generating electric energy and also generating thermal loss, and/or a transformer and/or an electric driven motor, and/or a heat discharging device used for discharging heat to the exterior or an electric heater or air warmer or heat pump having the heat discharging device, and/or a cold discharging device used for discharging cold to the exterior or an air conditioner having the cold discharging device, and peripheral devices, drive control circuits devices, over-load protecting devices and/or temperature protection devices are optionally installed according to actual needs for assisting the operation of the electric energy application device assembly (108);
- drive control circuit device (112): constituted by solid-state or electromechanical components, or chips and relevant operation software; the drive control circuit device (112) is optionally installed;
- temperature protecting device (102): constituted by the electromechanical thermal actuated switch or thermal braking fuse, or solid-state temperature detecting unit or solid-state temperature switch unit, so when the load is overheated, the operation of electric energy application device assembly (108) and the fluid pump (105) can be controlled directly or through the drive control circuit device (112); the temperature protecting device (102) is optionally installed.

According to the heat-dissipating structure having suspended external tube and internally recycling heat transfer fluid and application apparatus, with the pumping operation provided by the fluid pump (105), the gaseous or liquid heat transfer fluid is allowed to pass the heat transfer fluid outlet port at the front portion of the inner tube (103), then pass the heat transfer fluid path formed on the surface or the interior of the electric energy application device assembly (108) which generates thermal loss during operation and the heat dissipater (104) thereof, then pass the heat transfer fluid path formed between the interior of the external tube (101) and the inner tube (103) thereby being leaded to the distal end of the external tube (101) then returned from the heat transfer fluid inlet port at the distal end of the inner tube (103), thereby forming a closed recycling heat transfer fluid loop, or the heat transfer fluid pumped by the fluid pump (105) can pass the mentioned paths in a reverse order and in the reverse flowing direction thereby forming a closed recycling heat transfer fluid loop having reverse order and reverse flowing direction, so through the heat transfer fluid passing the outer surface of the electric energy application device assembly (108) and the heat dissipater thereof, and/or the exposed portion of the external tube (101), temperature equalizing operation is enabled to be performed with the external gaseous environment or the liquid or solid environment manually installed but not disposed in the stratum or liquid of the shallow ground natural thermal energy body.

When the external tube (101) is formed as a vertically upward or obliquely upward or spirally upward structure, the fluid can take advantage of the physical effect of hot ascending/cold descending to allow the fluid having higher temperature to ascend in the inner tube and the fluid having lower temperature to descend in the interior of the external tube, thereby forming a flow recycling, and/or the fluid pump (105) can be further installed.

Figure 10:
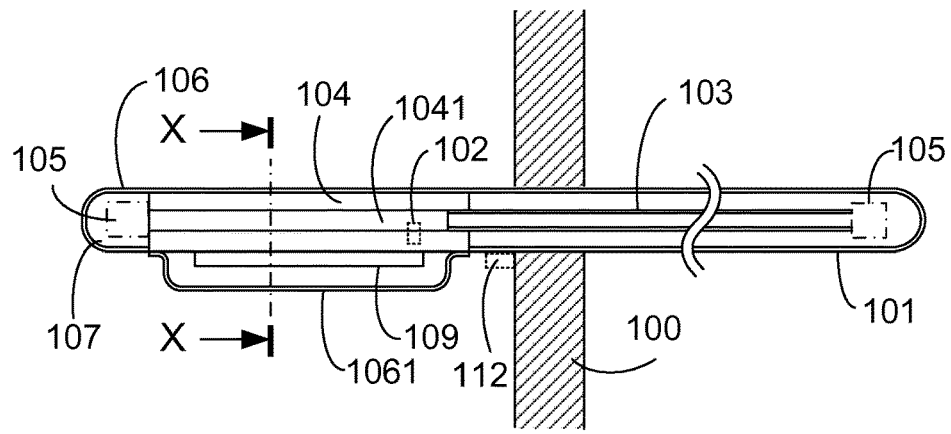
FIG. 10 is a schematic structural view of the present invention illustrating the electric illuminating device (109) being adopted as the electric energy application device assembly (108) and/or the heat dissipater (104) thereof.

According to the heat-dissipating structure having suspended external tube and internally recycling heat transfer fluid and application apparatus, the electric energy application device assembly (108) can be combined and applied in many fields under the same theory and structure, including an electric illuminating device (109) e.g. an illumination device adopting LED, and/or a photovoltaic (110) e.g. a solar panel, and/or a wind power generating device (111), and/or a transformer (444), and/or a motor (333) driven by electric energy, and/or a heat discharging device used for discharging heat to the exterior or an electric heater or air warmer or heat pump having the heat discharging device, and/or a cold discharging device used for discharging cold to the exterior or an air conditioner having the cold discharging device, and peripheral devices, drive control circuits devices, overload protecting devices and/or temperature protection devices are optionally installed according to actual needs for assisting the operation of the electric energy application device assembly (108); what shall be addressed is that the applicable fields are numerous and following embodiments are provided for illustrating some applied structures and installation means:

FIG. 10 is a schematic structural view of the present invention illustrating the electric illuminating device (109) being adopted as the electric energy application device assembly (108) and/or the heat dissipater (104) thereof.

Figure 11:
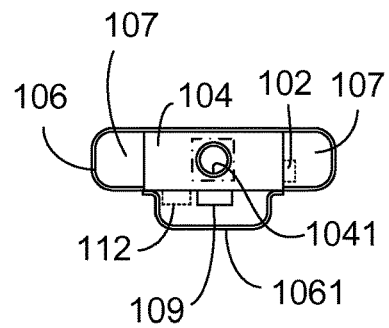
FIG. 11 is a cross sectional view of FIG. 10 taken along X-X.

FIG. 11 is a cross sectional view of FIG. 10 taken along X-X.

As shown in FIG. 10 and FIG. 11, the main configuration includes one or more than one of the external tube (101), the inner tube (103), the fluid pump (105), and the electric energy application device assembly (108) is designed to adopt the electric illuminating device (109) which generates thermal loss e.g. the illumination device adopting LED, and peripheral devices, drive control circuits devices, overload protecting devices and/or temperature protection devices are optionally installed according to actual needs for assisting the operation of the electric illuminating device (109);

When two or more than two of the external tubes (101) are installed and individually provided with the inner tube (103) therein, the fluid paths formed by the individual external tube (101) and the inner tube (103) thereof can be connected in serial or in parallel and leaded to a common electric illuminating device (109), or respectively leaded to a corresponding electric illuminating device (109), and can be designed to share a common fluid pump (105) or respectively installed with a fluid pump (105);

Wherein: the heat transfer fluid pumped by the fluid pump (105) passes the heat transfer fluid path (1041) in the interior of the electric illuminating device (109) or the heat dissipater (104) thereof, and passes the heat transfer fluid path (107) formed between the interior of the external tube (101) and the inner tube (103), so through the heat transfer fluid passing the outer surface of the electric illuminating device (109) and/or the heat dissipater (104) thereof, and/or the exposed portion of the external tube (101), temperature equalizing operation is enabled to be performed with the external gaseous environment or the liquid or solid environment manually installed but not disposed in the stratum or liquid of the shallow ground natural thermal energy body;

When the external tube (101) is formed as a vertically upward or obliquely upward or spirally upward structure, the fluid can take advantage of the physical effect of hot ascending/cold descending to allow the fluid having higher temperature to ascend in the inner tube and the fluid having lower temperature to descend in the interior of the external tube, thereby forming a flow recycling, and/or the fluid pump (105) can be further installed;

electric illuminating device (109): related to a moveable lamp such as a desk lamp, standing lamp, working lamp, illumination lamp or a lamp installed inside or outside of a building, constituted by an illuminating device utilizing electric energy being converted into photo energy which is composed of various gaseous lamps, solid-state LED or OLED, and other peripheral devices e.g. a light-pervious member (1061) shall be provided according to actual needs, and further including a display screen, a billboard, a signal or a warning sign operated through the photo energy of the electric illuminating device (109);

fluid pump (105): constituted by a pump driven by an electric motor, and served for being used to pump the gaseous or liquid heat transfer fluid according to the controlled flowing direction and flowing rate;

drive control circuit device (112): constituted by solid-state or electromechanical components, or chips and relevant operation software; the drive control circuit device (112) is served to provide the input voltage, the current and the working temperature to the electric illuminating device (109) and to control the operation timing of the fluid pump (105);

temperature protecting device (102): constituted by the electromechanical thermal actuated switch or thermal braking fuse, or solid-state temperature detecting unit or solid-state temperature switch unit, installed in the electric illuminating device (109) or the heat dissipater (104) thereof, so when the temperature is abnormal, the operation of electric illuminating device (109) and the fluid pump (105) can be controlled directly or through the drive control circuit device (112); the temperature protecting device (102) is optionally installed.

Figure 12:
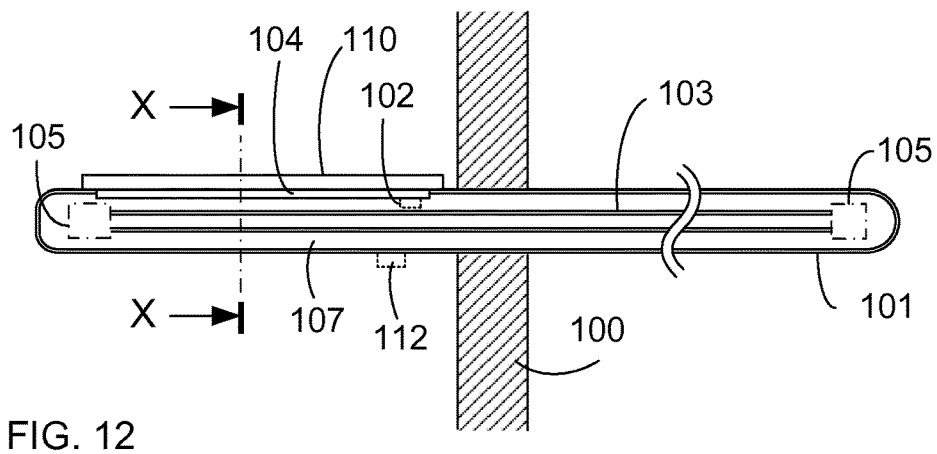
FIG. 12 is a schematic structural view of the present invention illustrating the photovoltaic (110) being adopted as the electric energy application device assembly (108).

FIG. 12 is a schematic structural view of the present invention illustrating the photovoltaic (110) being adopted as the electric energy application device assembly (108).

Figure 13:
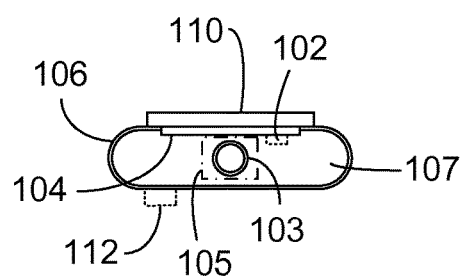
FIG. 13 is a cross sectional view of FIG. 12 taken along X-X.

FIG. 13 is a cross sectional view of FIG. 12 taken along X-X.

As shown in FIG. 12 and FIG. 13, the main configuration includes one or more than one of the external tube (101), the inner tube (103), the fluid pump (105), and the electric energy application device assembly (108) is designed to adopt the photovoltaic (110) capable of converting photo energy into electric energy and generating thermal loss, and drive control circuits devices, overload protecting devices and/or temperature protection devices are optionally installed according to actual needs for assisting the operation of the photovoltaic (110);

When two or more than two of the external tubes (101) are installed and individually provided with the inner tube (103) therein, the fluid paths formed by the individual external tube (101) and the inner tube (103) thereof can be connected in serial or in parallel and leaded to a common photovoltaic (110), or respectively leaded to a corresponding photovoltaic (110), and can be designed to share a common fluid pump (105) or respectively installed with a fluid pump (105);

Wherein: the heat transfer fluid pumped by the fluid pump (105) passes the heat transfer fluid path (107) on the surface or the interior of the backside substrate of the photovoltaic (110) and/or the heat dissipater (104) thereof, and passes the interior of the external tube (101), so through the heat transfer fluid passing the outer surface of the photovoltaic (110) and/or the heat dissipater (104) thereof, and/or the exposed portion of the external tube (101), temperature equalizing operation is enabled to be performed with the external gaseous environment or the liquid or solid environment manually installed but not disposed in the stratum or liquid of the shallow ground natural thermal energy body;

When the external tube (101) is formed as a vertically upward or obliquely upward or spirally upward structure, the fluid can take advantage of the physical effect of hot ascending/cold descending to allow the fluid having higher temperature to ascend in the inner tube and the fluid having lower temperature to descend in the interior of the external tube, thereby forming a flow recycling, and/or the fluid pump (105) can be further installed;

photovoltaic (110): constituted by various types of photovoltaic which receives lights for generating and outputting electric energy, e.g. a solar panel, and other relevant peripheral devices;

fluid pump (105): constituted by a pump driven by an electric motor, and served for being used to pump the gaseous or liquid heat transfer fluid according to the controlled flowing direction and flowing rate;

drive control circuit device (112): constituted by solid-state or electromechanical components, or chips and relevant operation software; the drive control circuit device (112) is served to control the input voltage, the current and the working temperature of the photovoltaic (110) and to control the operation timing of the fluid pump (105);

temperature protecting device (102): constituted by the electromechanical thermal actuated switch or thermal braking fuse, or solid-state temperature detecting unit or solid-state temperature switch unit, so when the temperature of the photovoltaic (110) is abnormal, the operation of photovoltaic (110) and the fluid pump (105) can be controlled directly or through the drive control circuit device (112); the temperature protecting device (102) is optionally installed.

FIG. 14 is a schematic structural view of the present invention illustrating the wind power generating device (111) being adopted as the electric energy application device assembly (108).

As shown in FIG. 14, the main configuration includes one or more than one of the external tube (101), the inner tube (103) and the fluid pump (105), and the electric energy application device assembly (108) is designed to adopt a wind power generator (222) of the wind power generating device (111), and peripheral devices, drive control circuits devices, overload protecting devices and/or temperature protection devices are optionally installed according to actual needs for assisting the operation of the wind power generating device (111);

When two or more than two of the external tubes (101) are installed and individually provided with the inner tube (103) therein, the fluid paths formed by the individual external tube (101) and the inner tube (103) thereof can be connected in serial or in parallel and leaded to a common wind power generator (222), or respectively leaded to a corresponding wind power generator (222), and can be designed to share a common fluid pump (105) or respectively installed with a fluid pump (105);

Wherein: the heat transfer fluid pumped by the fluid pump (105) passes the heat transfer fluid path in the interior of the wind power generator (222) of the wind power generating device (111) and/or the heat dissipater thereof, or further including the heat transfer fluid path in the drive control circuit device (112) and/or the heat dissipater thereof, and the closed heat transfer fluid path is jointly defined by the inner tube (103) and the partitioned space formed between the inner tube (103) and the interior of the external tube (101) thereby allowing the heat transfer fluid to flow therein, and the temperature equalizing operation is enabled to be performed with the external gaseous environment or the liquid or solid environment manually installed but not disposed in the stratum or liquid of the shallow ground natural thermal energy body through the exposed portion of the external tube (101);

When the external tube (101) is formed as a vertically upward or obliquely upward or spirally upward structure, the fluid can take advantage of the physical effect of hot ascending/cold descending to allow the fluid having higher temperature to ascend in the inner tube and the fluid having lower temperature to descend in the interior of the external tube, thereby forming a flow recycling, and/or the fluid pump (105) can be further installed;

wind power generating device (111): constituted by wind turbine blades and the wind power generator (222) driven thereby and/or the drive control circuit device (112) and other relevant peripheral devices, wherein the wind power generator (222) and/or the drive control circuit device (112) are the main components receiving the heat dissipating operation;

fluid pump (105): constituted by a pump driven by a wind power driven rotating shaft or driven by electric energy, used for pumping the gaseous or liquid heat transfer fluid with respect to the controlled flowing direction and flowing rate of the fluid to be pumped;

drive control circuit device (112): constituted by solid-state or electromechanical components, or chips and relevant operation software, used for controlling the operation of the system in the wind power generating device (111), including the output voltage, the current and the working temperature of the wind power generator (222), AC and DC converting, parallel controlling of AC output electric energy and public electricity system, and controlling the operation timing of the fluid pump (105);

temperature protecting device (102): constituted by the electromechanical thermal actuated switch or thermal braking fuse, or solid-state temperature detecting unit or solid-state temperature switch unit, so when the temperature of the wind power generating device (111) is abnormal, the system operation of the wind power generator (222) and/or the wind power generating device (111) can be controlled directly or through the drive control circuit device (112), and controlling the fluid pump (105); the temperature protecting device (102) is optionally installed.

FIG. 15 is a schematic structural view of the present invention illustrating the transformer (444) being adopted as the electric energy application device assembly (108).

As shown in FIG. 15, the main configuration includes one or more than one of the external tube (101), the inner tube (103) and the fluid pump (105), and the electric energy application device assembly (108) is designed to adopt a transformer (444), and peripheral devices, drive control circuits devices, overload protecting devices and/or temperature protection devices are optionally installed according to actual needs for assisting the operation of the transformer (444);

When two or more than two of the external tubes (101) are installed and individually provided with the inner tube (103) therein, the fluid paths formed by the individual external tube (101) and the inner tube (103) thereof can be connected in serial or in parallel and leaded to a common transformer (444), or respectively leaded to a corresponding transformer (444), and can be designed to share a common fluid pump (105) or respectively installed with a fluid pump (105);

Wherein: the heat transfer fluid pumped by the fluid pump (105) passes the heat transfer fluid path (107) in the interior of the transformer (444) or the heat dissipater thereof, and passes the interior of the external tube (101), so through the heat transfer fluid passing the outer surface of the transformer (444) and/or the heat dissipater thereof, and/or the exposed portion of the external tube (101), temperature equalizing operation is enabled to be performed with the external gaseous environment or the liquid or solid environment manually installed but not disposed in the stratum or liquid of the shallow ground natural thermal energy body;

When the external tube (101) is formed as a vertically upward or obliquely upward or spirally upward structure, the fluid can take advantage of the physical effect of hot ascending/cold descending to allow the fluid having higher temperature to ascend in the inner tube and the fluid having lower temperature to descend in the interior of the external tube, thereby forming a flow recycling, and/or the fluid pump (105) can be further installed;

transformer (444): provided with winding sets, magnetic conductive wirings and an enclosure, used for outputting and inputting single-phase or three-phase (including multiple-phase) AC electric energy, or inputting and outputting pulse electric energy; the transformer includes the self-coupled or separated-winding transformer having a dry structure containing gas or wet structure containing cooling fluid, the surface or the exterior of the transformer is formed with a pipeline heat dissipating structure allowing the fluid to pass, or formed with a fluid inlet/outlet port allowing the fluid to flow in or out the internal space of the transformer; the transformer is combined on the fastening and supporting structural member (100) through a transformer support rack (445);

fluid pump (105): constituted by a pump driven by electric energy, and used for pumping the gaseous or liquid heat transfer fluid according to the controlled flowing direction and flowing rate;

drive control circuit device (112): constituted by solid-state, or electromechanical components, or chips and relevant operation software; the drive control circuit device (112) is used for controlling the output voltage, the current and the working temperature of the transformer (444), and controlling the operation timing of the fluid pump (105);

temperature protecting device (102): constituted by the electromechanical thermal actuated switch or thermal braking fuse, or solid-state temperature detecting unit or solid-state temperature switch unit, so when the temperature of the transformer (444) is abnormal, the operation of transformer (444) and the fluid pump (105) can be controlled directly or through the drive control circuit device (112); the temperature protecting device (102) is optionally installed.

Figures 16, 17:
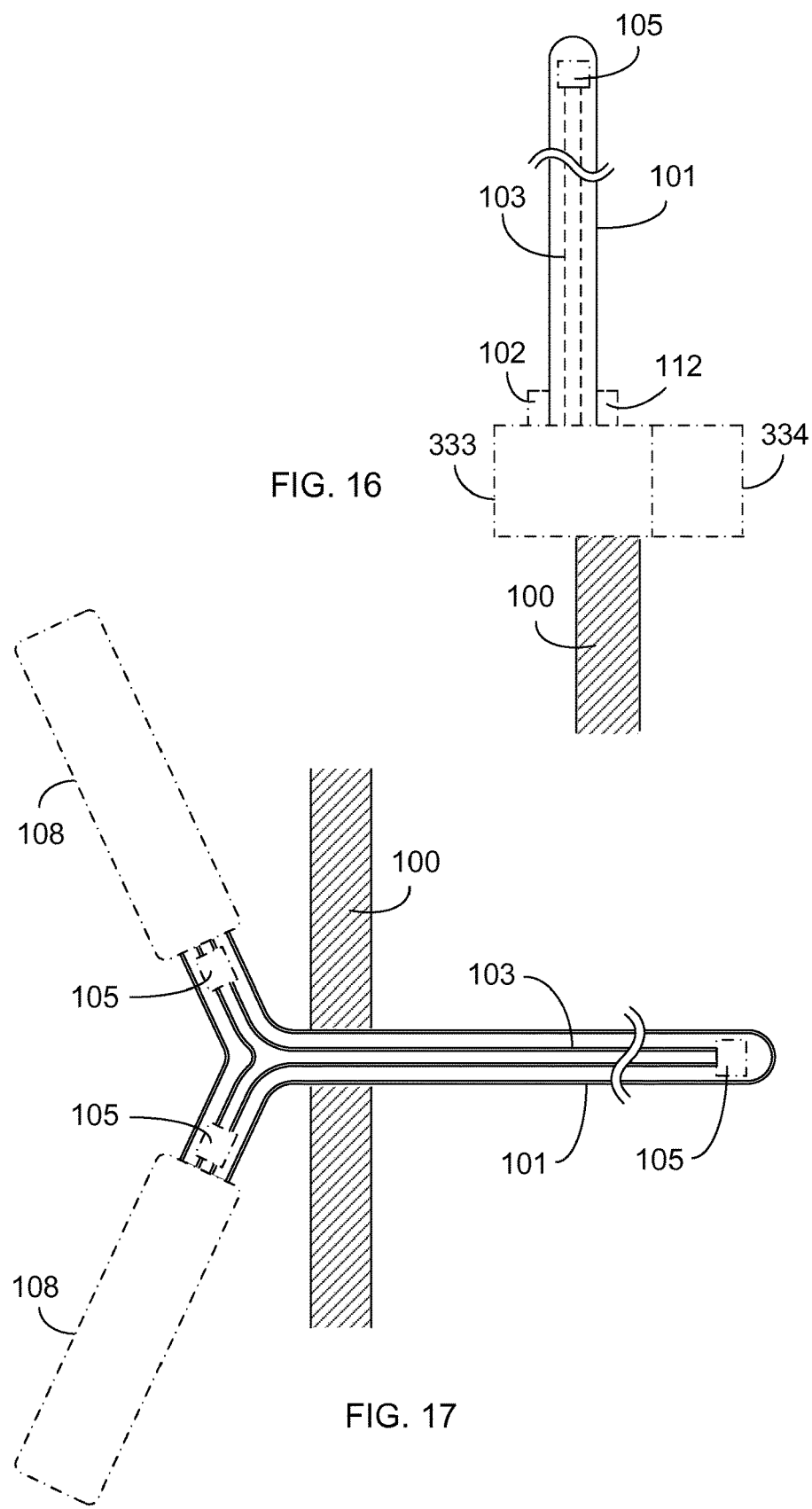
FIG. 16 is a schematic structural view of the present invention illustrating the motor (333) driven by electric energy being adopted as the electric energy application device assembly (108).
FIG. 17 is a schematic structural view of the present invention showing the front portion of the external tube (101) being formed with a manifold structure for being installed with plural electric energy application device assemblies (108) which sharing the mid tube body and the distal tube body of the external tube (101).

FIG. 16 is a schematic structural view of the present invention illustrating the motor (333) driven by electric energy being adopted as the electric energy application device assembly (108).

As shown in FIG. 16, the main configuration includes one or more than one of the external tube (101), the inner tube (103) and the fluid pump (105), and the electric energy application device assembly (108) is designed to adopt an electric driven motor (333), and peripheral devices, drive control circuits devices, overload protecting devices and/or temperature protection devices are optionally installed according to actual needs for assisting the operation of the motor (333);

When two or more than two of the external tubes (101) are installed and individually provided with the inner tube (103) therein, the fluid paths formed by the individual external tube (101) and the inner tube (103) thereof can be connected in serial or in parallel and leaded to a common motor (333), or respectively leaded to a corresponding motor (333), and can be designed to share a common fluid pump (105) or respectively installed with a fluid pump (105);

Wherein: the heat transfer fluid pumped by the fluid pump (105) passes the heat transfer fluid path in the interior of the electric driven motor (333) or the heat dissipater thereof, and passes the interior of the external tube (101), so through the heat transfer fluid passing the outer surface of the motor (333) and/or the heat dissipater thereof, and/or the exposed portion of the external tube (101), temperature equalizing operation is enabled to be performed with the external gaseous environment or the liquid or solid environment manually installed but not disposed in the stratum or liquid of the shallow ground natural thermal energy body;

When the external tube (101) is formed as a vertically upward or obliquely upward or spirally upward structure, the fluid can take advantage of the physical effect of hot ascending/cold descending to allow the fluid having higher temperature to ascend in the inner tube and the fluid having lower temperature to descend in the interior of the external tube, thereby forming a flow recycling, and/or the fluid pump (105) can be further installed;

motor (333): constituted by a revolving electromechanical device driven by AC or DC electric energy for outputting rotational kinetic energy thereby driving the motor driven load (334);

fluid pump (105): constituted by a pump driven by the electric motor, used for pumping the gaseous or liquid heat transfer fluid according to the controlled flowing direction and flowing rate;

drive control circuit device (112): constituted by solid-state or electromechanical components, or chips and relevant operation software; the drive control circuit device (112) is used for controlling the input voltage, the current and the working temperature of the electric driven motor (333), and controlling the operation timing of the fluid pump (105);

temperature protecting device (102): constituted by the electromechanical thermal actuated switch or thermal braking fuse, or solid-state temperature detecting unit or solid-state temperature switch unit, so when the temperature of the electric driven motor (333) is abnormal, the operation of motor (333) and the fluid pump (105) can be controlled directly or through the drive control circuit device (112); the temperature protecting device (102) is optionally installed.

According to the heat-dissipating structure having suspended external tube and internally recycling heat transfer fluid and application apparatus, the front portion of the external tube (101) and the inner tube (103) can be further formed with a manifold structure for being installed with plural the same or different electric energy application device assemblies (108) which can share the mid tube body and the distal tube body;

FIG. 17 is a schematic structural view of the present invention showing the front portion of the external tube (101) being formed with a manifold structure for being installed with plural electric energy application device assemblies (108) which sharing the mid tube body and the distal tube body of the external tube (101).

As shown in FIG. 17, the main configuration includes the mentioned external tube (101), the inner tube (103), the fluid pump (105), wherein the front portion of the external tube (101) is formed with a manifold structure allowing plural electric energy application device assemblies (108) to be installed thereon, and formed with a common mid tube body and distal tube body of the external tube (101), and same or different electric energy application device assemblies (108) are respectively installed on the manifold formed on the front portion of the external tube (101), and correspondingly installed with an inner tube (103) in the external tube (101);

Wherein: the heat transfer fluid pumped by the fluid pump (105) passes the heat transfer fluid path on the surface or in the interior of the individual electric energy application device assembly (108) or the heat dissipater (104) thereof, and passes the interior of the external tube (101), so through the heat transfer fluid passing the outer surface of the electric energy application device assembly (108) or the heat dissipater thereof, and/or the exposed portion of the external tube (101), temperature equalizing operation is enabled to be performed with the external gaseous environment or the liquid or solid environment manually installed but not disposed in the stratum or liquid of the shallow ground natural thermal energy body.

Figure 18:
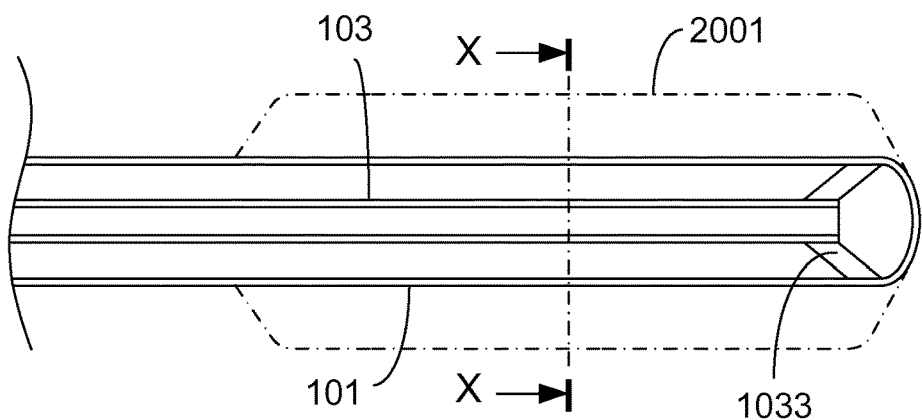
FIG. 18 is a first schematic view showing the tube structure of the present invention.

According to the heat-dissipating structure having suspended external tube and internally recycling heat transfer fluid and application apparatus, there are many ways to form the heat transfer fluid path through the distal portion of the external tube (101) and the inner tube (103), followings are examples for illustration and shall not be seen as a limitation to the present invention, structures having the same functional operations are all within the scope of the present invention: wherein the structure formed through the external tube (101) and the inner tube (103) includes one or more than one of followings:

FIG. 18 is a first schematic view showing the tube structure of the present invention.

Figure 19:
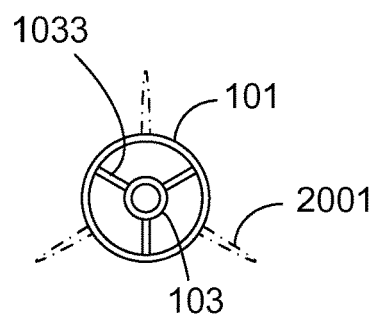
FIG. 19 is a cross sectional view of FIG. 18 taken along X-X.

FIG. 19 is a cross sectional view of FIG. 18 taken along X-X.

As shown in FIG. 18 and FIG. 19, the main configuration is that the external tube (101) and the inner tube (103) are arranged in coaxial or in a substantially parallel manner, the space defined by the periphery of the inner tube (103) and between the external tube (101) and the inner tube (103) is served to allow the heat transfer fluid to pass, the inner tube (103) installed in the external tube (101) is shorter than the external tube (101), a length differentiation is formed between the distal end thereof and the sealed part at the distal portion of the external tube (101) and a supporter (1033) is provided for fastening, thereby forming the space allowing the heat transfer fluid to pass.

Figure 20:
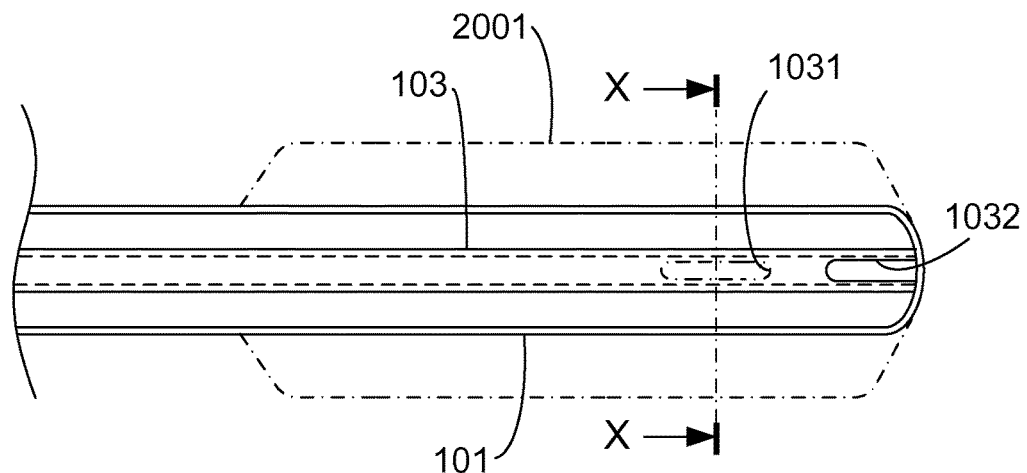
FIG. 20 is a second schematic view showing the tube structure of the present invention.

FIG. 20 is a second schematic view showing the tube structure of the present invention.

Figure 21:
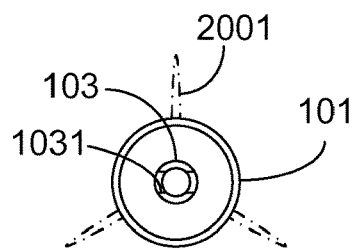
FIG. 21 is a cross sectional view of FIG. 20 taken along X-X.

FIG. 21 is a cross sectional view of FIG. 20 taken along X-X.

As shown in FIG. 20 and FIG. 21, the main configuration is that the external tube (101) and the inner tube (103) are installed in parallel, the distal end of the inner tube (103) inside the external tube (101) is combined with the sealed part at the bottom of distal portion of the external tube (101), and the distal end of the inner tube (103) or a transversal hole (1031) or a notch (1032) penetrating the inner tube at the distal portion of the inner tube (103) are forming the space allowing the heat transfer fluid to pass.

Figure 22:
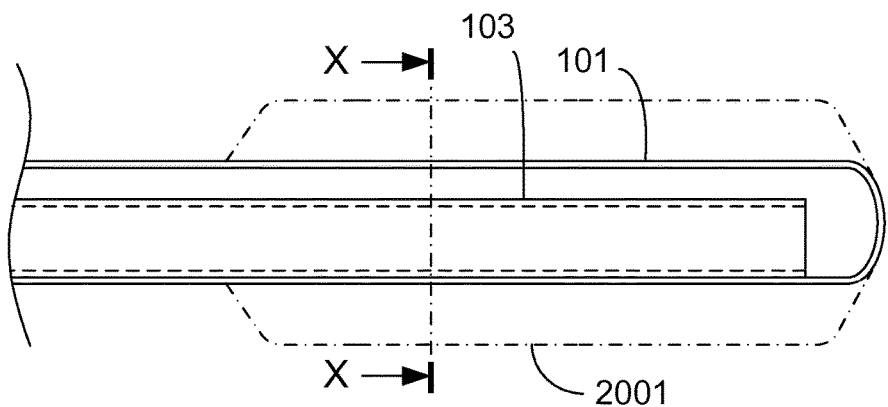
FIG. 22 is the third schematic view showing the tube structure of the present invention.

FIG. 22 is the third schematic view showing the tube structure of the present invention.

Figure 23:
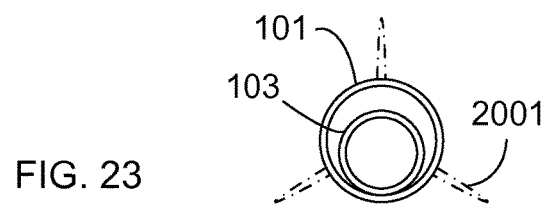
FIG. 23 is a cross sectional view of FIG. 22 taken along X-X.

FIG. 23 is a cross sectional view of FIG. 22 taken along X-X.

As shown in FIG. 22 and FIG. 23, the main configuration is that the external tube (101) and the inner tube (103) are eccentrically arranged, the distal end of the inner tube (103) installed inside the external tube (101) is shorter, a length differentiation is formed between the distal end thereof and the sealed part at the bottom of the distal portion of the external tube (101) thereby forming a space allowing the heat transfer fluid to pass.

Figure 24:
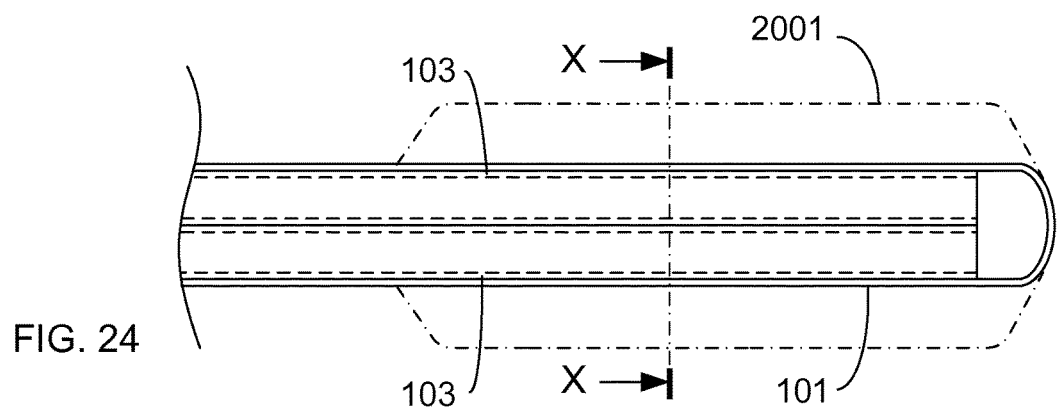
FIG. 24 is a fourth schematic view showing the tube structure of the present invention.

FIG. 24 is a fourth schematic view showing the tube structure of the present invention.

Figure 25:
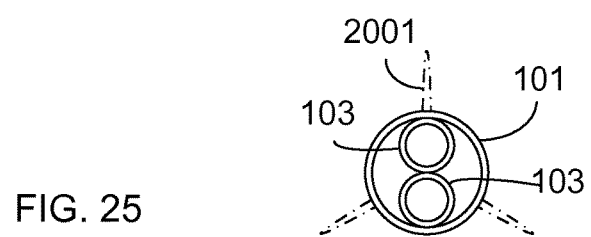
FIG. 25 is a cross sectional view of FIG. 24 taken along X-X.

FIG. 25 is a cross sectional view of FIG. 24 taken along X-X.

As shown in FIG. 24 and FIG. 25, the main configuration is that the external tube (101) and two or more than two of the inner tubes (103) are installed in parallel, the distal portion of the inner tube (103) installed inside the external tube (101) is shorter, a length differentiation is formed between the distal portion thereof and the sealed part at the bottom of the distal portion of the external tube (101) thereby forming a space allowing the heat transfer fluid to pass.

Figure 26:
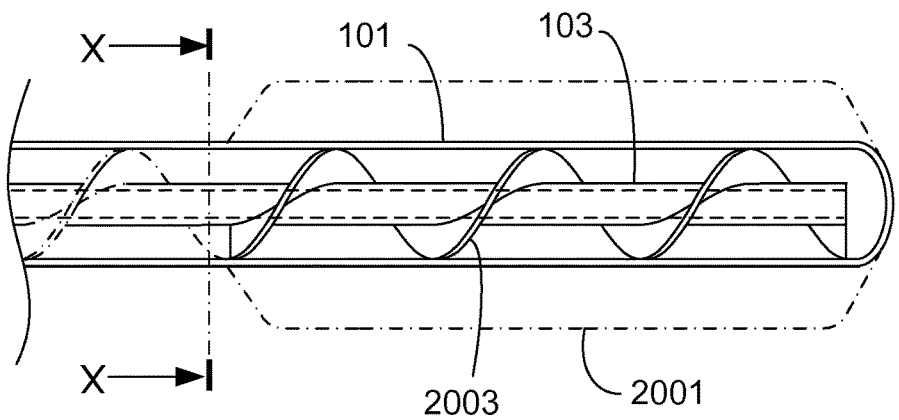
FIG. 26 is a fifth schematic view showing the tube structure of the present invention.

FIG. 26 is a fifth schematic view showing the tube structure of the present invention.

Figure 27:
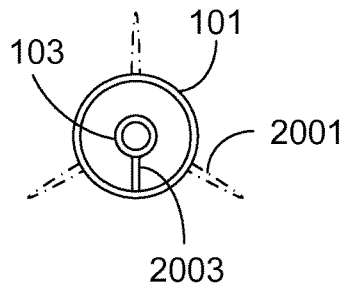
FIG. 27 is a cross sectional view of FIG. 26 taken along X-X.

FIG. 27 is a cross sectional view of FIG. 26 taken along X-X.

As shown in FIG. 26 and FIG. 27, the main configuration is that the external tube (101) and the inner tube (103) are arranged in coaxial or in a substantially parallel manner, the space defined by the periphery of the inner tube (103) and between the external tube (101) and the inner tube (103) is served to allow the heat transfer fluid to pass, the inner tube (103) installed inside the external tube (101) is shorter than the external tube (101), a length differentiation is formed between the distal portion thereof and the sealed part at the bottom of the distal portion of the external tube (101) thereby forming a space allowing the heat transfer fluid to pass, a spiral flow guiding structure (2003) is further installed between the external tube (101) and the inner tube (103) thereby increasing the length of the heat transfer fluid path formed between the external tube (101) and the inner tube (103).

Figures 28, 29:
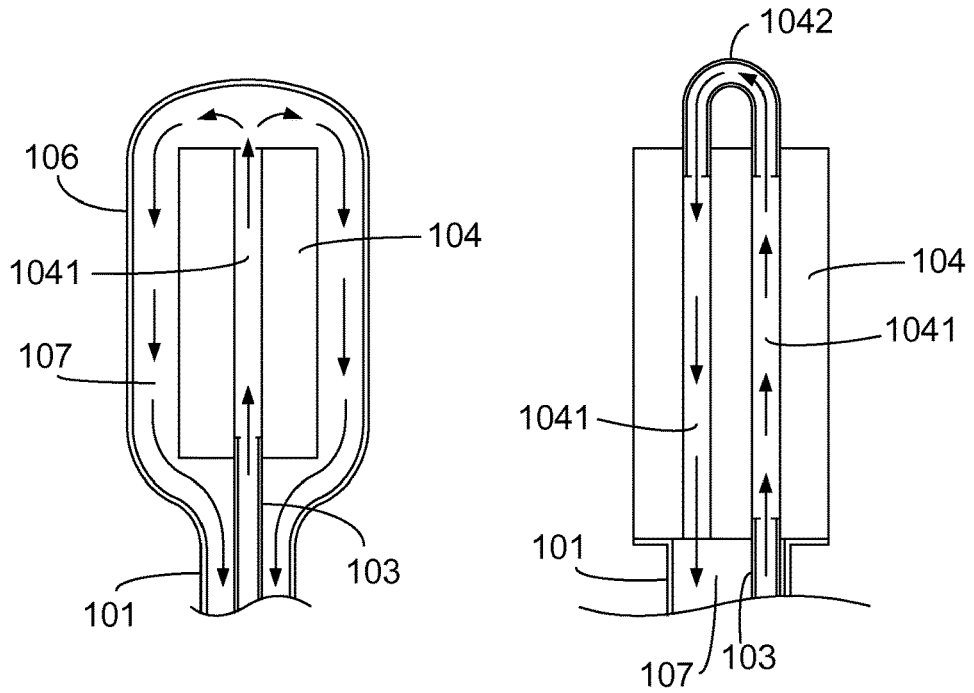
FIG. 28 is a schematic structural view of the present invention showing a heat transfer fluid path allowing the gaseous or liquid heat transfer fluid to pass being formed through the space defined by the heat dissipater (104) of the electric energy application device assembly (108) and the housing (106) and the heat transfer fluid path (1041) of the heat dissipater (104).
FIG. 29 is a schematic structural view of the present invention showing a heat transfer fluid path allowing the gaseous or liquid heat transfer fluid to pass being formed through at least two heat transfer fluid paths (1041) of the heat dissipater (104) installed in the electric energy application device assembly (108) being serially connected with a U-shaped connection tube (1042).

FIG. 28 is a schematic structural view of the present invention showing a heat transfer fluid path allowing the gaseous or liquid heat transfer fluid to pass being formed through the space defined by the heat dissipater (104) of the electric energy application device assembly (108) and the housing (106) and the heat transfer fluid path (1041) of the heat dissipater (104).

As shown in FIG. 28, the main configuration is that a heat transfer fluid path allowing the gaseous or liquid heat transfer fluid to pass is formed through the space defined by the heat dissipater (104) of the electric energy application device assembly (108) and the housing (106) and the heat transfer fluid path (1041) of the heat dissipater (104).

FIG. 29 is a schematic structural view of the present invention showing a heat transfer fluid path allowing the gaseous or liquid heat transfer fluid to pass being formed through at least two heat transfer fluid paths (1041) of the heat dissipater (104) installed in the electric energy application device assembly (108) being serially connected with a U-shaped connection tube (1042).

As shown in FIG. 29, the main configuration is that at least two heat transfer fluid paths (1041) of the heat dissipater (104) installed in the electric energy application device assembly (108) are connected with a U-shaped connection tube (1042) in serial, so as to constitute a heat transfer fluid path allowing the gaseous or liquid heat transfer fluid to pass.

Figure 30:
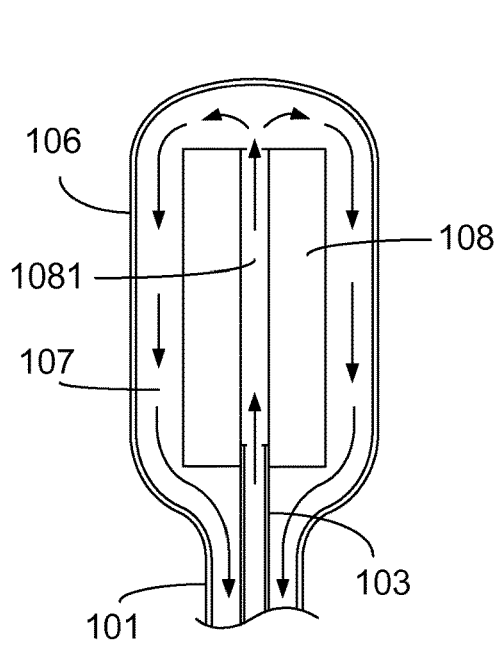
FIG. 30 is a schematic structural view of the present invention showing a heat transfer fluid path allowing the gaseous or liquid heat transfer fluid to pass being formed through the space defined by the electric energy application device assembly (108) and the housing (106) and the heat transfer fluid path (1081) provided by the electric energy application device assembly (108).

FIG. 30 is a schematic structural view of the present invention showing a heat transfer fluid path allowing the gaseous or liquid heat transfer fluid to pass being formed through the space defined by the electric energy application device assembly (108) and the housing (106) and the heat transfer fluid path (1081) provided by the electric energy application device assembly (108).

As shown in FIG. 30, the main configuration is that through the space defined by the electric energy application device assembly (108) and the housing (106) and the heat transfer fluid path (1081) provide by the electric energy application device assembly (108), a heat transfer fluid path allowing the gaseous or liquid heat transfer fluid to pass is formed.

Figure 31:
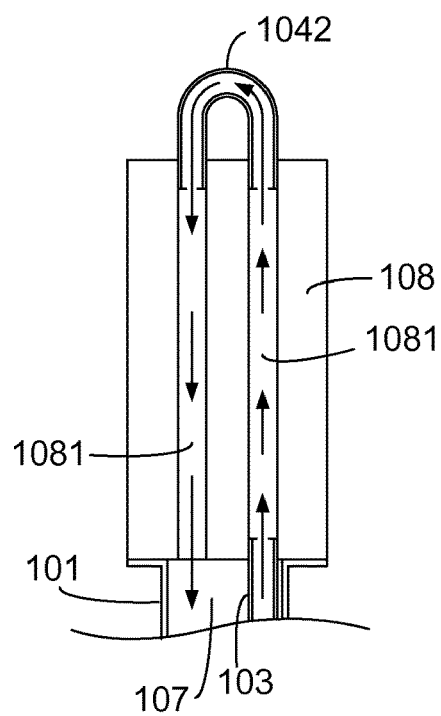
FIG. 31 is a schematic structural view of the present invention showing a heat transfer fluid path allowing the gaseous or liquid heat transfer fluid to pass being formed through at least two heat transfer fluid paths (1081) of the electric energy application device assembly (108) being serially connected with a U-shaped connection tube (1042).

FIG. 31 is a schematic structural view of the present invention showing a heat transfer fluid path allowing the gaseous or liquid heat transfer fluid to pass being formed through at least two heat transfer fluid paths (1081) of the electric energy application device assembly (108) being serially connected with a U-shaped connection tube (1042).

As shown in FIG. 31, the main configuration is that at least two of the heat transfer fluid paths (1081) provided by the electric energy application device assembly (108) are connected in serial with a U-shaped connection tube (1042), thereby to constitute a heat transfer fluid path allowing the gaseous or liquid heat transfer fluid to pass.

Figure 32:
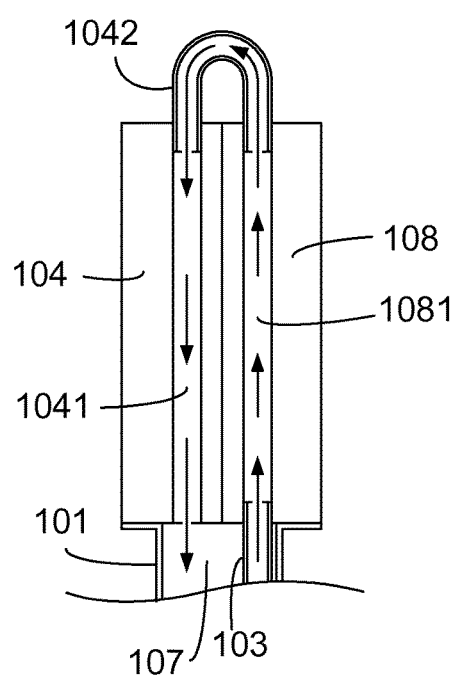
FIG. 32 is a schematic structural view of the present invention showing a heat transfer fluid path allowing the gaseous or liquid heat transfer fluid to pass being formed through a U-shaped connection tube (1042) being connected between at least one heat transfer fluid path (1081) of the electric energy application device assembly (108) and at least one heat transfer fluid path (1041) of the heat dissipater (104) thereof.

FIG. 32 is a schematic structural view of the present invention showing a heat transfer fluid path allowing the gaseous or liquid heat transfer fluid to pass being formed through a U-shaped connection tube (1042) being connected between at least one heat transfer fluid path (1081) of the electric energy application device assembly (108) and at least one heat transfer fluid path (1041) of the heat dissipater (104) thereof.

As shown FIG. 32, the main configuration is that at least one heat transfer fluid path (1081) provided by the electric energy application device assembly (108) and at least one heat transfer fluid path (1041) provided by the heat dissipater (104) thereof are connected in serial with a U-shaped connection tube (1042), thereby to constitute a heat transfer fluid path allowing the gaseous or liquid heat transfer fluid to pass.

Figure 33:
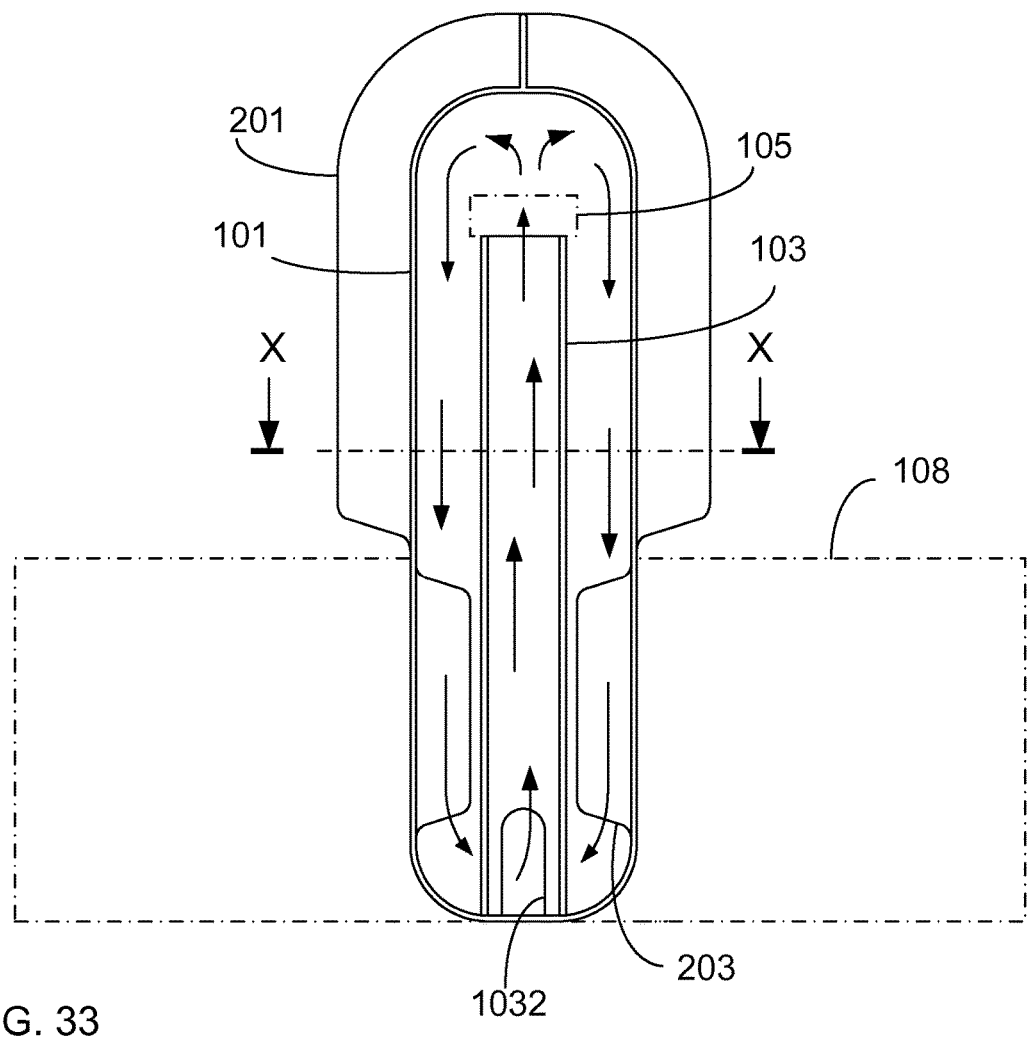
FIG. 33 is a schematic view showing the main structure being vertically installed according to one embodiment of the present invention.

The applicable fields of the heat-dissipating structure having suspended external tube and internally recycling heat transfer fluid and application apparatus are very flexible, wherein the heat-dissipating structure having internally recycling heat transfer fluid flowing in tubes and installed in the electric energy application device assembly (108) can be one or more than one, the exposed portion of the external tube (101) enables the temperature equalizing operation to be performed with the external gaseous environment or the liquid or solid environment manually installed but not disposed in the stratum or liquid of the shallow ground natural thermal energy body, the surface of the external tube (101) can be optionally installed with external heat guiding plates (201), the portion of the surface of the external tube (101) which is disposed in the interior of the electric energy application device assembly (108) can be optionally installed with inner heat guiding plates (203), and the installation and operating direction are not limited, illustrations are provided as followings:

FIG. 33 is a schematic view showing the main structure being vertically installed according to one embodiment of the present invention.

Figure 34:
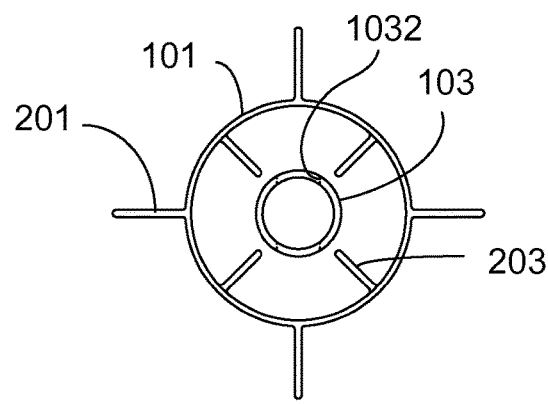
FIG. 34 is a cross sectional view of FIG. 33 taken along X-X.

FIG. 34 is a cross sectional view of FIG. 33 taken along X-X.

As shown in FIG. 33 and FIG. 34, the main configuration is that the heat-dissipating structure having internally recycling heat transfer fluid flowing in tubes is combined and vertically installed in electric energy application device assembly (108), the fastening means can be the conventional means such as utilizing a support rod or chain or hook or a suspending hook device for fastening a standing lamp or ceiling lamp or a standing fan or ceiling fan, thereby being able to be vertically installed at the top of a building or the top of a structural unit having internal space or a moveable object.

Figure 35:
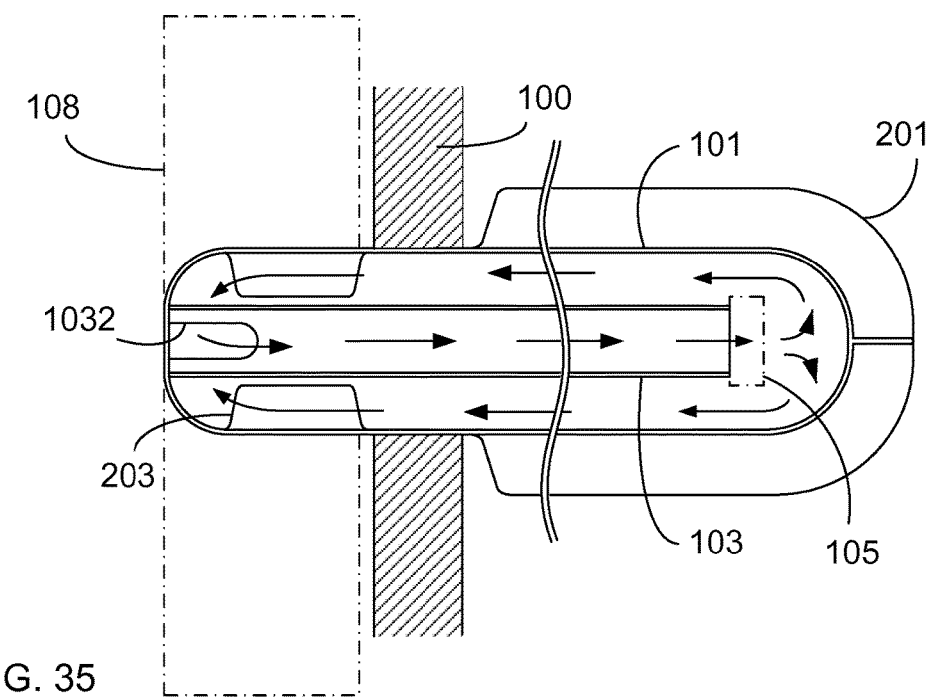
FIG. 35 is a schematic structural diagram of one embodiment showing the present invention being horizontally and penetratingly installed on a wall.

The installation means disclosed in the embodiment shown in FIG. 33 and FIG. 34 includes one or more than one of following installation means:

FIG. 35 is a schematic structural diagram of one embodiment showing the present invention being horizontally and penetratingly installed on a wall.

As shown in FIG. 35, the main configuration is that the heat-dissipating structure having internally recycling heat transfer fluid flowing in tubes is combined and horizontally installed in the electric energy application device assembly (108), the fastening means can be the conventional means such as horizontally installing a window-type air conditioner on a wall or the window of a freezing cabinet of a transportation vehicle, thereby being able to be horizontally installed on the lateral side of a building or the lateral side of a structural unit or a moveable object.

Figure 36:
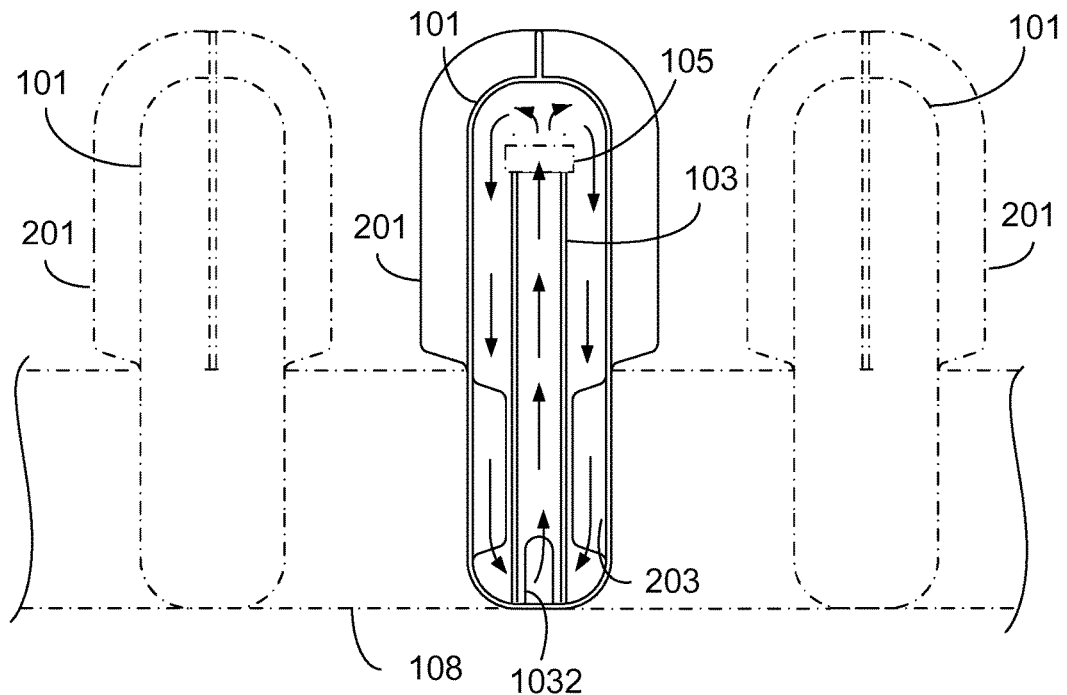
FIG. 36 is a schematic structural diagram showing single electric energy application device assembly (108) being vertically installed with plural heat-dissipating structures having internally recycling heat transfer fluid flowing in tubes.

FIG. 36 is a schematic structural diagram showing single electric energy application device assembly (108) being vertically installed with plural heat-dissipating structures having internally recycling heat transfer fluid flowing in tubes.

As shown in FIG. 36, the main configuration is that single electric energy application device assembly (108) is vertically installed with two or more than two of the heat-dissipating structures having internally recycling heat transfer fluid flowing in tubes, the fastening means can be the conventional means such as utilizing a support rod or chain or hook or a suspending hook device for fastening a standing lamp or ceiling lamp or a standing fan or ceiling fan, thereby being able to be vertically installed at the top of a building or the top of a structural unit having internal space or a moveable object.

Figure 37:
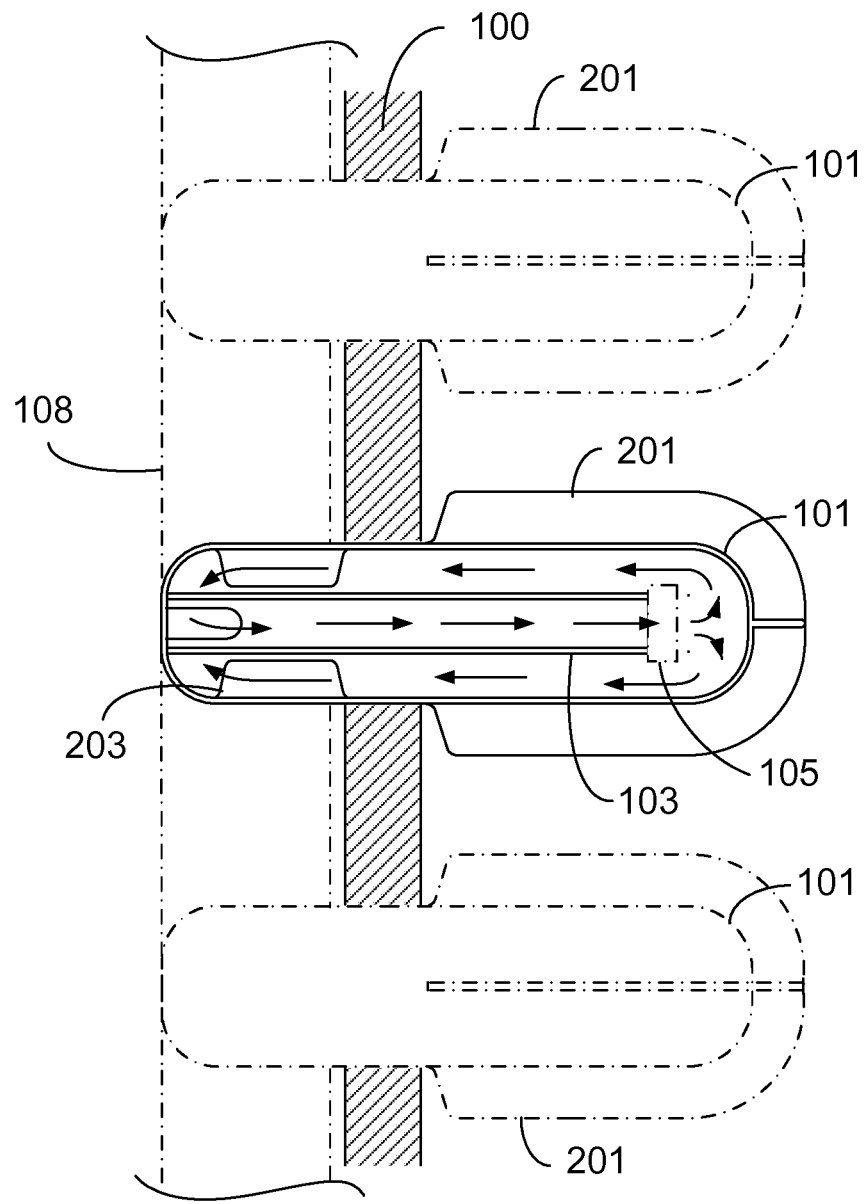
FIG. 37 is a schematic structural view of one embodiment showing single electric energy application device assembly (108) being installed with plural heat-dissipating structures having internally recycling heat transfer fluid flowing in tubes for being horizontally and penetratingly installed on a wall.

FIG. 37 is a schematic structural view of one embodiment showing single electric energy application device assembly (108) being installed with plural heat-dissipating structures having internally recycling heat transfer fluid flowing in tubes for being horizontally and penetratingly installed on a wall.

As shown in FIG. 37, the main configuration is that single electric energy application device assembly (108) is horizontally installed with two or more than two of the heat-dissipating structures having internally recycling heat transfer fluid flowing in tubes, the fastening means can be the conventional means such as horizontally installing a window-type air conditioner on a wall or the window of a freezing cabinet of a transportation vehicle, thereby being able to be horizontally installed on the lateral side of a building or the lateral side of a structural unit or a moveable object.

The heat-dissipating structure having suspended external tube and internally recycling heat transfer fluid and application apparatus can not only be applied for being combined and installed as what the embodiments has disclosed above, but also can be applied in the electric energy application device assembly (108) composed of various lamps and/or the heat discharging device used for discharging heat to the exterior or an electric heater or air warmer or heat pump having the heat discharging device, and/or the cold discharging device used for discharging cold to the exterior or an air conditioner having the cold discharging device, the theory and structure of installing the external tube with a suspending manner and the heat-dissipating structure of the internally recycling heat transfer fluid are the same as the disclosed embodiments therefore no further illustration is provided.

The invention claimed is:

1. A heat-dissipating structure with internally circulating heat transfer fluid, comprising:
at least one external tube (101) having a suspended distal end and at least one inner tube (103) installed within the at least one external tube (101), the at least one external tube (101) having an inner diameter that is larger than an outer diameter of the at least one inner tube (103), a space between the inner diameter of the at least one external tube (101) and the outer diameter of the at least one inner tube (103) forming an exterior fluid path, wherein the at least one external tube (101) and the at least one inner tube (103) installed in the at least one external tube (101) each has a front end and the at least one inner tube (103) has a distal end that is within the suspended distal end of a respective said at least one external tube (101), wherein the front end of each of the at least one external tube (101) and the at least one inner tube (103) includes a front tube port through which heat transfer fluid passes to or returns from at least one heat transfer fluid path that extends through or past an electric energy application device assembly (108) and/or a heat dissipater (104), wherein the heat transfer fluid is a gaseous heat transfer fluid, wherein the suspended distal end of the at least one external tube (101) is sealed and the distal end of the at least one inner tube (103) installed in the at least one external tube (101) includes fluid holes or has an open end and is spaced from the sealed and suspended distal end of the at least one external tube (101) to enable the heat transfer fluid to flow through the fluid holes or open end between the exterior fluid path and an interior fluid path within the at least one inner tube (103) and thereby provide a fluid circulation path for circulation of the heat transfer fluid between the exterior fluid path, the internal fluid path, and a heat transfer fluid path through or past the electric energy application device assembly (108) and/or heat dissipater (104), and wherein the at least one heat transfer fluid path is formed according to at least one of the following configurations:

(a) the at least one heat transfer fluid path extends through or past the electric energy application device assembly (108) from said front tube port of the at least one inner tube (103) to the front tube port of the at least one external tube (101), (b) the at least one heat transfer fluid path extends through or past the heat dissipater (104) from said front tube port of the at least one inner tube (103) to the front tube port of the at least one external tube (101), (c) the at least one heat transfer fluid path is connected to at least one heat transfer fluid path of the heat dissipater (104), and the respective heat transfer fluid paths of the electric energy application device (108) and heat dissipater (104) are connected to the respective front tube ports of the at least one inner tube (103) and the at least one external tube (101), (d) the electric energy application device assembly (108) includes at least two internal heat transfer fluid paths (1081), or a U-shaped or L-shaped internal fluid path, connected through external tubes to form a fluid inlet port and a fluid outlet port respectively connected to the front tube ports of the at least one inner tube (103) and the at least one external tube (101), (e) an exterior of the electric energy application device (108) is enclosed within a sealed housing, thereby forming a space between the electric energy application device (108) and the sealed housing to allow fluid to pass, said space being in communication with the front tube ports of the at least one inner tube (103) and the at least one external tube (101) through at least one fluid inlet/outlet port, (f) a sealed space allowing passage of the heat transfer fluid is formed between the electric energy application device assembly (108), the heat dissipater (104), and a housing of the electric energy application assembly (108) and the heat dissipater, said sealed space being in communication with the front tube ports of the at least one inner tube (103) and the at least one external tube (101) through at least one fluid inlet/outlet port, and (g) a sealed space allowing passage of the heat transfer fluid is jointly formed by a matched housing and an exterior of the electric energy application device assembly (108) and/or the heat dissipater (104), and the electric energy application device assembly (108) and/or the heat dissipater (104) includes at least one heat transfer fluid path, one end of which is formed with a heat transfer fluid connection port connected to the front tube port of the at least one inner tube (103) and a second end of which is formed with a heat transfer fluid connection port in communication with the sealed space, the sealed space being in communication with the front port of the at least one external tube (101) via a heat transfer fluid connection port of the sealed housing, wherein the inner tube (103) is made of a thermal insulating material, or the inner tube (103) includes a thermal insulating material on an inside or outside of the inner tube (103), wherein the external tube (101) is made of a heat conductive material to enable transfer of heat from the heat transfer fluid to an external gaseous environment surrounding the at least one external tube (101) as the heat transfer fluid flows through the external fluid path, and wherein the electric energy application device assembly (108) includes at least one of an illumination device, a photovoltaic or photoelectric generator device, a wind powered generator, a transformer, an electrical motor, a heat discharging device, an air warmer, a heat pump, a cold discharging device, and an air conditioner.

2. A heat-dissipating structure with internally circulating heat transfer fluid as claimed in claim 1, further comprising at least one fluid pump (105) installed in at least one of the at least one exterior fluid path and the interior fluid path to control a flow direction of the heat transfer fluid in the fluid circulation path, wherein the heat transfer fluid pumped by the at least one fluid pump (105) passes through the external fluid path to transfer heat from the electric energy application device assembly (108) and/or heat dissipater (104) to the external gaseous environment surrounding the external tube (101).

3. A heat-dissipating structure with internally circulating heat transfer fluid as claimed in claim 1, wherein circulation of the heat transfer fluid is facilitated by convection resulting from warmer fluid ascending through the interior fluid path and cooler fluid descending through the exterior fluid path as heat is transferred from the exterior fluid path to the external gaseous environment surrounding the external tube (101).

4. A heat-dissipating structure with internally circulating heat transfer fluid as claimed in claim 1, wherein the at least one external tube (101) is divided into a front tube body, a middle tube body, and a distal tube body, wherein the electric energy application device assembly (108) and/or the heat dissipater (104) is installed on the front tube body, wherein the middle tube body provides support and transfer of thermal energy of the heat transfer fluid from an interior of the at least one external tube (101) to the surroundings of the at least one external tube (101), and wherein the distal tube body performs a temperature equalizing operation with respect to the external gaseous environment surrounding the at least one external tube (101) and provides a connecting fluid path between the inner tube (103) and the at least one external tube (101).

5. A heat-dissipating structure with internally circulating heat transfer fluid as claimed in claim 1, further comprising a drive control circuit device (112) for controlling at least one of: (a) an input voltage, input current, and/or working temperature of an illumination device (109), and (b) a flowrate, a flow direction, and/or an operation timing of the at least one fluid pump (105).

6. A heat-dissipating structure with internally circulating heat transfer fluid as claimed in claim 1, wherein the distal end of the at least one external tube (101) is sealed and the at least one external tube (101) and the inner tube (103) are arranged in at least one of the following configurations:
   (a) the at least one external tube (101) and the inner tube (103) are coaxial or substantially parallel, and the inner tube (103) is shorter than the at least one external tube (101) to form a space for passage of the heat transfer fluid between the at least one external tube (101) and the inner tube (103), a distal end of the inner tube (103) being positioned relative to the at least one external tube (101) by a support (1033);
   (b) the at least one external tube (101) and the inner tube (103) are parallel, the distal end of the inner tube (103) extends to and is combined with the sealed distal end of the at least one external tube (101), and a traverse hole (1031) or notch (1032) is provided in the distal end of the inner tube (103) to permit passage of the heat transfer fluid between the at least one external tube (101) and the inner tube (103);
   (c) the at least one external tube (101) and the inner tube (103) are eccentrically arranged, and the inner tube (103) is shorter than the at least one external tube (101) to form a space for passage of the heat transfer fluid between the at least one external tube (101) and the inner tube (103);
   (d) at least one second inner tube (103) is installed within the at least one external tube (101) in parallel with the at least one external tube (101) and the first inner tube (103), and each said inner tube (103) is shorter than the at least one external tube (101) to form spaces for passage of the heat transfer fluid between the at least one external tube (101) and a respective said inner tube (103); and
   (e) the at least one external tube (101) and the inner tube (103) are coaxial or substantially parallel, and the inner tube (103) is shorter than the at least one external tube (101) to form a space for passage of the heat transfer fluid between the at least one external tube (101) and the inner tube (103), a spiral flow guiding structure (2003) being further provided between the at least one external tube (101) and the inner tube (103), thereby increasing a length of a heat transfer fluid path formed between the at least one external tube (101) and the inner tube (103).

7. A heat-dissipating structure with internally circulating heat transfer fluid as claimed in claim 1, wherein the electric energy application device assembly (108) is installed in one of the following configurations: (a) horizontally installed on the lateral side of a building, structural unit, or movable object; (b) vertically installed at the top of a building, structural unit, or movable object; and (c) installed between the heat-dissipating structure and a second heat-dissipating structure.

8. A heat-dissipating structure with internally circulating heat transfer fluid as claimed in claim 1, wherein the external tube (101) is round.

9. A heat-dissipating structure with internally circulating heat transfer fluid as claimed in claim 1, wherein the external tube (101) is made of a heat conductive material.

10. A heat-dissipating structure with internally circulating heat transfer fluid as claimed in claim 1, further comprising heat transfer fins (2001) extending from an exterior of the external tube (101).

11. A heat-dissipating structure with internally circulating heat transfer fluid as claimed in claim 1, further comprising external heat guiding plates (201) installed on a surface of the external tube (101).

12. A heat-dissipating structure with internally circulating heat transfer fluid as claimed in claim 1, comprising at least two said external tubes (101), each individually provided with at least one said inner tube (103), wherein respective said inner tubes (103) are connected in series or in parallel to each other.

13. A heat-dissipating structure with internally circulating heat transfer fluid as claimed in claim 1, wherein a connection between the at least one external tube (101) and the electric energy application device assembly (108) includes at least one extended structure having at least one of the following geometric configurations:
   (a) the at least one extended structure is linear;
   (b) the at least one extended structure includes a bend;
   (c) the at least one extended structure has a U-shape;
   (d) the at least one extended structure including at least one loop;
   (e) the at least one extended structure is a spiral structure;
   (f) the at least one extended structure includes a wave like bending structure.

14. A heat-dissipating structure with internally circulating heat transfer fluid as claimed in claim 1, wherein the electric energy application device assembly (108) includes an illumination device (109) comprising at least one of a gaseous lamp and a solid state LED or OLED, or a transparent member (1061) and at least one of a display screen, a billboard, and a signal or warning sign operated through the light output by the illumination device (109).

15. A heat-dissipating structure with internally circulating heat transfer fluid as claimed in claim 1, wherein the electric energy application device assembly (108) is a photovoltaic device (110) for converting light into electrical energy, and further comprising a drive control circuit device (112) for controlling at least one of: (a) an output voltage, output current, and/or working temperature of the photovoltaic device (110), and (b) a flowrate, a flow direction, and/or an operation timing of the at least one fluid pump (105).

16. A heat-dissipating structure with internally circulating heat transfer fluid as claimed in claim 15, including at least two said external tubes (101), each said external tube (101) including at least one said inner tube (103), wherein the at least two said external tubes (101) are connected to a common said photovoltaic device (110).

17. A heat-dissipating structure with internally circulating heat transfer fluid as claimed in claim 15, including at least two said external tubes (101), each said external tube (101) including at least one said inner tube (103), wherein the at least two said external tubes (101) are each connected to a respective said photovoltaic device (110).

18. A heat-dissipating structure with internally circulating heat transfer fluid as claimed in claim 1, including at least two said external tubes (101), each said external tube (101) including at least one said inner tube (103), wherein the at least two said external tubes (101) share a common fluid pump (105).

19. A heat-dissipating structure with internally circulating heat transfer fluid as claimed in claim 1, including at least two said external tubes (101), each said external tube (101) including at least one said inner tube (103), wherein the at least two said external tubes (101) are each connected to a respective individual fluid pump (105).

20. A heat-dissipating structure with internally circulating heat transfer fluid as claimed in claim 19, wherein the at least one electric energy application device assembly (108) is a wind power generating device (111), and further comprising a drive control circuit device (112) for controlling at least one of: (a) an output voltage, output current, and/or working temperature of the wind power generating device (111), and (b) a flowrate, a flow direction, and/or an operation timing of the at least one fluid pump (105).

21. A heat-dissipating structure with internally circulating heat transfer fluid as claimed in claim 20, including at least two said external tubes (101), each said external tube (101) including at least one said inner tube (103), wherein the at least two said external tubes (101) are connected to a common said wind power generating device (111).

22. A heat-dissipating structure with internally circulating heat transfer fluid as claimed in claim 20, including at least two said external tubes (101), each said external tube (101) including at least one said inner tube (103), wherein the at least two said external tubes (101) are each connected to a respective said wind power generating device (111).

23. A heat-dissipating structure with internally circulating heat transfer fluid as claimed in claim 1, wherein the at least one electric energy application device assembly (108) is a transformer (444), and further comprising a drive control circuit device (112) for controlling at least one of: (a) an input or output voltage, input or output current, and/or working temperature of the transformer (444), and (b) a flowrate, a flow direction, and/or an operation timing of the at least one fluid pump (105).

24. A heat-dissipating structure with internally circulating heat transfer fluid as claimed in claim 23, including at least two said external tubes (101), each said external tube (101) including at least one said inner tube (103), wherein the at least two said external tubes (101) are connected to a common said transformer (444).

25. A heat-dissipating structure with internally circulating heat transfer fluid as claimed in claim 23, including at least two said external tubes (101), each said external tube (101) including at least one said inner tube (103), wherein the at least two said external tubes (101) are each connected to a respective said transformer (444).

26. A heat-dissipating structure with internally circulating heat transfer fluid as claimed in claim 1, wherein the at least one electric energy application device assembly (108) is a motor (333), and further comprising a drive control circuit device (112) for controlling at least one of: (a) an input voltage, input current, and/or working temperature of the motor (333), and (b) a flowrate, a flow direction, and/or an operation timing of the at least one fluid pump (105).

27. A heat-dissipating structure with internally circulating heat transfer fluid as claimed in claim 26, including at least two said external tubes (101), each said external tube (101) including at least one said inner tube (103), wherein the at least two said external tubes (101) are connected to a common said motor (333).

28. A heat-dissipating structure with internally circulating heat transfer fluid as claimed in claim 26, including at least two said external tubes (101), each said external tube (101) including at least one said inner tube (103), wherein the at least two said external tubes (101) are each connected to a respective said motor (333).

29. A heat-dissipating structure with internally circulating heat transfer fluid as claimed in claim 1, wherein the at least one heat transfer fluid path formed within the electric energy application device assembly (108) has said configuration (a).

30. A heat-dissipating structure with internally circulating heat transfer fluid as claimed in claim 1, wherein the at least one heat transfer fluid path formed within the electric energy application device assembly (108) has said configuration (b).

31. A heat-dissipating structure with internally circulating heat transfer fluid as claimed in claim 1, wherein the at least one heat transfer fluid path formed within the electric energy application device assembly (108) has said configuration (c).

32. A heat-dissipating structure with internally circulating heat transfer fluid as claimed in claim 1, wherein the at least one heat transfer fluid path formed within the electric energy application device assembly (108) has said configuration (d).

33. A heat-dissipating structure with internally circulating heat transfer fluid as claimed in claim 1, wherein the at least one heat transfer fluid path formed within the electric energy application device assembly (108) has said configuration (e).

34. A heat-dissipating structure with internally circulating heat transfer fluid as claimed in claim 1, wherein the at least one heat transfer fluid path formed within the electric energy application device assembly (108) has said configuration (f).

35. A heat-dissipating structure with internally circulating heat transfer fluid as claimed in claim 1, wherein the at least one heat transfer fluid path formed within the electric energy application device assembly (108) has said configuration (g).

36. A heat-dissipating structure with internally circulating heat transfer fluid as claimed in claim 1, wherein a portion of an interior surface of the external tube (101) that is disposed in an interior of the electric energy application device (108) is installed with inner heat guiding plates (203).

* * * * *